United States Patent
Ryu et al.

(10) Patent No.: US 12,446,433 B2
(45) Date of Patent: Oct. 14, 2025

(54) DISPLAY DEVICE INCLUDING SINGLE-LAYERED AND MULTI-LAYERED PERIPHERAL REGIONS

(71) Applicant: Samsung Display Co., Ltd., Yongin-si (KR)

(72) Inventors: Jang Wi Ryu, Yongin-si (KR); Byung-Chul Kim, Yongin-si (KR); Jaemin Seong, Yongin-si (KR); Inseok Song, Yongin-si (KR); Halim Ji, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 380 days.

(21) Appl. No.: 18/094,443

(22) Filed: Jan. 9, 2023

(65) Prior Publication Data
US 2023/0329063 A1    Oct. 12, 2023

(30) Foreign Application Priority Data
Apr. 12, 2022   (KR) .................. 10-2022-0045411

(51) Int. Cl.
*H10K 59/38* (2023.01)
*H10K 59/122* (2023.01)
*H10K 59/80* (2023.01)

(52) U.S. Cl.
CPC ........... *H10K 59/38* (2023.02); *H10K 59/122* (2023.02); *H10K 59/873* (2023.02)

(58) Field of Classification Search
CPC ...... H10K 59/38; H10K 50/86; H10K 59/122; H10K 59/121; H10K 59/35

USPC ............................................................ 257/91
See application file for complete search history.

(56) References Cited

U.S. PATENT DOCUMENTS

| | | | |
|---|---|---|---|
| 2020/0091247 A1* | 3/2020 | Lee | H10K 59/40 |
| 2020/0212113 A1* | 7/2020 | Song | H10K 59/122 |
| 2021/0036063 A1* | 2/2021 | Kim | G02B 5/201 |
| 2021/0111363 A1* | 4/2021 | Hwang | H10K 59/8792 |
| 2021/0193742 A1* | 6/2021 | Kim | H10K 50/856 |

(Continued)

FOREIGN PATENT DOCUMENTS

| | | |
|---|---|---|
| CN | 110707138 | 1/2020 |
| KR | 10-2021-0078613 | 6/2021 |

(Continued)

*Primary Examiner* — Nduka E Ojeh
(74) *Attorney, Agent, or Firm* — Womble Bond Dickinson (US) LLP

(57) ABSTRACT

A display device including a base layer including first to third pixel regions and a peripheral region, light emission elements, and a color filter layer. The color filter layer includes a first color filter overlapping the first pixel region and the peripheral region, and including first and second openings, a second color filter overlapping the second pixel region and the peripheral region, and including third and fourth openings, and a third color filter overlapping the third pixel region and the peripheral region, and including fifth and sixth openings. The peripheral region includes a single-layered region not overlapped by the first and second color filters and overlapped by the third color filter and a multi-layered region overlapped by at least two of the first and third color filters. The single-layered region is disposed on an outer side of each of the first to fourth openings in a plan view.

21 Claims, 20 Drawing Sheets

(56) References Cited

U.S. PATENT DOCUMENTS

2021/0249478 A1 8/2021 Oh et al.
2021/0328197 A1 10/2021 Xu et al.
2021/0399068 A1 12/2021 Kim et al.

FOREIGN PATENT DOCUMENTS

KR  10-2021-0101380  8/2021
KR  10-2021-0157932  12/2021

* cited by examiner

DISPLAY DEVICE INCLUDING SINGLE-LAYERED AND MULTI-LAYERED PERIPHERAL REGIONS

CROSS-REFERENCE TO RELATED APPLICATION(S)

This U.S. non-provisional patent application claims priority to and benefits of Korean Patent Application No. 10-2022-0045411 under 35 U.S.C. § 119, filed on Apr. 12, 2022 in the Korean Intellectual Property Office, the entire contents of which are hereby incorporated by reference.

BACKGROUND

1. Technical Field

The disclosure herein relates to a display device having improved reliability.

2. Description of the Related Art

Multimedia display devices such as televisions, mobile phones, tablets, computers, navigation system units, and game consoles may each be equipped with a display panel for displaying images. The display panel may include pixels for displaying images, and each of the pixels may include a light emission element which generates light, and a circuit element connected to the light emission element.

In order to improve light emission efficiency and color purity of a display device, the display device may require various functional layers. As an example, a display device may include color filters, and a step may be generated in a region in which multiple color filters are laminated, which may cause a defect in the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device with improved reliability and improved display quality by reducing the thickness of a step generated in a color filter layer.

An embodiment provides a display device that may include a base layer including first to third pixel regions and a peripheral region surrounding the first to third pixel regions, light emission elements that provide a source light to the first to third pixel regions, and that are disposed on the base layer, and a color filter layer disposed on the light emission elements. The color filter layer may include a first color filter overlapping the first pixel region and the peripheral region, and including first and second openings respectively overlapping the second and third pixel regions, a second color filter overlapping the second pixel region and the peripheral region, and including third and fourth openings respectively overlapping the first and third pixel regions, and a third color filter overlapping the third pixel region and the peripheral region, and including fifth and sixth openings respectively overlapping the first and second pixel regions. The peripheral region may include a single-layered region not overlapped by the first and second color filters and overlapped by the third color filter and a multi-layered region overlapped by at least two of the first to third color filters, wherein the single-layered region is disposed on an outer side of each of the first to fourth openings in a plan view.

In an embodiment, the first color filter may include a first pattern overlapping the first pixel region, and a second pattern including the first and second openings, and that is spaced apart from the first pattern. The second color filter may include a third pattern including the third opening, and a fourth pattern overlapping the second pixel region, including the fourth opening, and that is spaced apart from the third pattern.

In an embodiment, the third pattern may cover the outer surface of the first pattern, and the fourth pattern may cover the outer surface of the second pattern and an inner surface of the second pattern defining the second opening.

In an embodiment, the first pattern may cover the outer surface of the third pattern, and the second pattern may cover the outer surface of the fourth pattern and the inner surface of the fourth pattern including the fourth opening.

In an embodiment, the second pattern may include a first pattern opening surrounding the first pattern, the fourth pattern may include a second pattern opening surrounding the third pattern, and an inner surface of the second pattern defining the first pattern opening and an inner surface of the fourth pattern defining the second pattern opening may be separated from the first and third patterns.

In an embodiment, the second pattern may include a first sub-pattern including the first opening, and a second sub-pattern including the second opening, and spaced apart from the first sub-pattern. The fourth pattern may include a third sub-pattern overlapping the second pixel region, and a fourth sub-pattern including the fourth opening defined thereon, and that is spaced apart from the third sub-pattern.

In an embodiment, the second pixel region and the third pixel region may be arranged in a direction, and the first pixel region may be arranged in a diagonal direction of the direction with respect to each of the second and third pixel regions. The single-layered region may not be disposed between the first pixel region and the second and third pixel regions.

In an embodiment, the first to third pixel regions may each be provided in a plurality, the first pixel regions may be arranged in a direction, and the second pixel regions and the third pixel regions may be arranged crosswise in the direction. The single-layered region may not be disposed between a second pixel region and a third pixel region which may be adjacent to each other among the second pixel regions and the third pixel regions.

In an embodiment, in a plan view, an area of the second pixel region may be less than an area of the first pixel region, and greater than an area of the third pixel region.

In an embodiment, the fifth opening may overlap an entirety of the first pixel region and may not overlap the peripheral region. The sixth opening may overlap an entirety of the second pixel region and may not overlap the peripheral region. The third color filter may overlap an entirety of the peripheral region.

In an embodiment, the fifth opening may overlap an entirety of the first pixel region and, in a plan view, an area of the fifth opening may be greater than an area of the first pixel region. The sixth opening may overlap an entirety of the second pixel region and, in a plan view, an area of the sixth opening may be greater than an area of the second pixel region. The third color filter may overlap all remaining regions of the peripheral region except for a region overlapping the fifth and sixth openings.

In an embodiment, a portion of the third color filter overlapping the multi-layered region may be disposed on the first and second color filters.

In an embodiment, the multi-layered region may surround each of the first to third pixel regions in a plan view.

In an embodiment, a display device may include a base layer including first to third pixel regions and a peripheral region surrounding the first to third pixel regions and including first and second regions, first to third light emission elements that respectively provide a source light to the first to third pixel regions, and that are disposed on the base layer, an encapsulation layer covering the first to third light emission elements, a bank portion including first to third bank openings respectively corresponding to the first to third light emission elements thereon, and disposed on the encapsulation layer, a light control unit including first to third light control patterns disposed respectively corresponding to the first to third bank openings, and a color filter layer disposed on the light control unit. The color filter layer may include a first color filter overlapping the first pixel region, and not overlapping the second and third pixel regions, a second color filter overlapping the second pixel region, and not overlapping the first and third pixel regions, and a third color filter overlapping the third pixel region, and not overlapping the first and second pixel regions. The first region may overlap only the third color filter, and the second region may overlap two or more of the first to third color filters.

In an embodiment, the first color filter may include a first pattern overlapping the first pixel region, and a second pattern including first and second openings respectively overlapping the second and third pixel regions, and spaced apart from the first pattern. The second color filter may include a third pattern including a third opening overlapping the first pixel region, and a fourth pattern overlapping the second pixel region, including a fourth opening defined overlapping the third pixel region, and spaced apart from the third pattern.

In an embodiment, the second pattern may include a first pattern opening surrounding the first pattern, the fourth pattern may include a second pattern opening surrounding the third pattern, and the inner surface of the second pattern defining the first pattern opening and an inner surface of the fourth pattern defining the second pattern opening may be separated from the first and third patterns.

In an embodiment, the second pattern may include a first sub-pattern including the first opening, and a second sub-pattern including the second opening, and spaced apart from the first sub-pattern. The fourth pattern may include a third sub-pattern overlapping the second pixel region, and a fourth sub-pattern including the fourth opening, and spaced apart from the third sub-pattern.

In an embodiment, the second region may surround each of the first to third pixel regions in a plan view, and the third color filter overlapping the second region may be disposed on the first and second color filters.

In an embodiment, the first and second light control patterns may each include quantum dots.

In an embodiment, the encapsulation layer may include a first inorganic layer, an organic layer disposed on the first inorganic layer, and a second inorganic layer disposed on the organic layer. The bank portion and the light control unit each may come into contact with the second inorganic layer.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
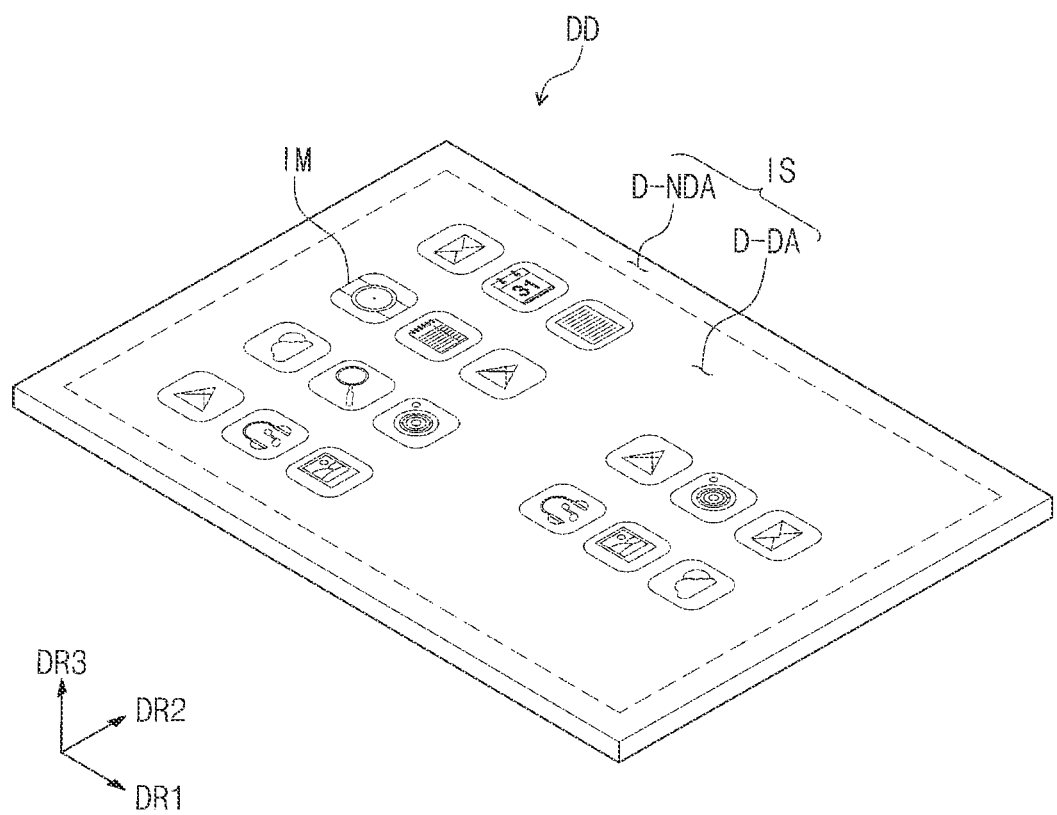
FIG. 1 is a schematic perspective view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the disclosure, when an element (or a region, a layer, a portion, and the like) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements may be exaggerated for an effective description of technical contents.

In the specification and the claims, the term "and/or" is intended to include any combination of the terms "and" and "or" for the purpose of its meaning and interpretation. For example, "A and/or B" may be understood to mean any combination including "A, B, or A and B." The terms "and"

and "or" may be used in the conjunctive or disjunctive sense and may be understood to be equivalent to "and/or."

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing from the scope the disclosure. The terms of a singular form may include the terms of a plural form unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the terms "comprise," "include," "have," and the like, are intended to specify the presence of stated features, integers, steps, operations, elements, components, or combinations thereof in the disclosure, but do not preclude the presence or addition of one or more other features, integers, steps, operations, elements, components, or combinations thereof.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Figure 2:
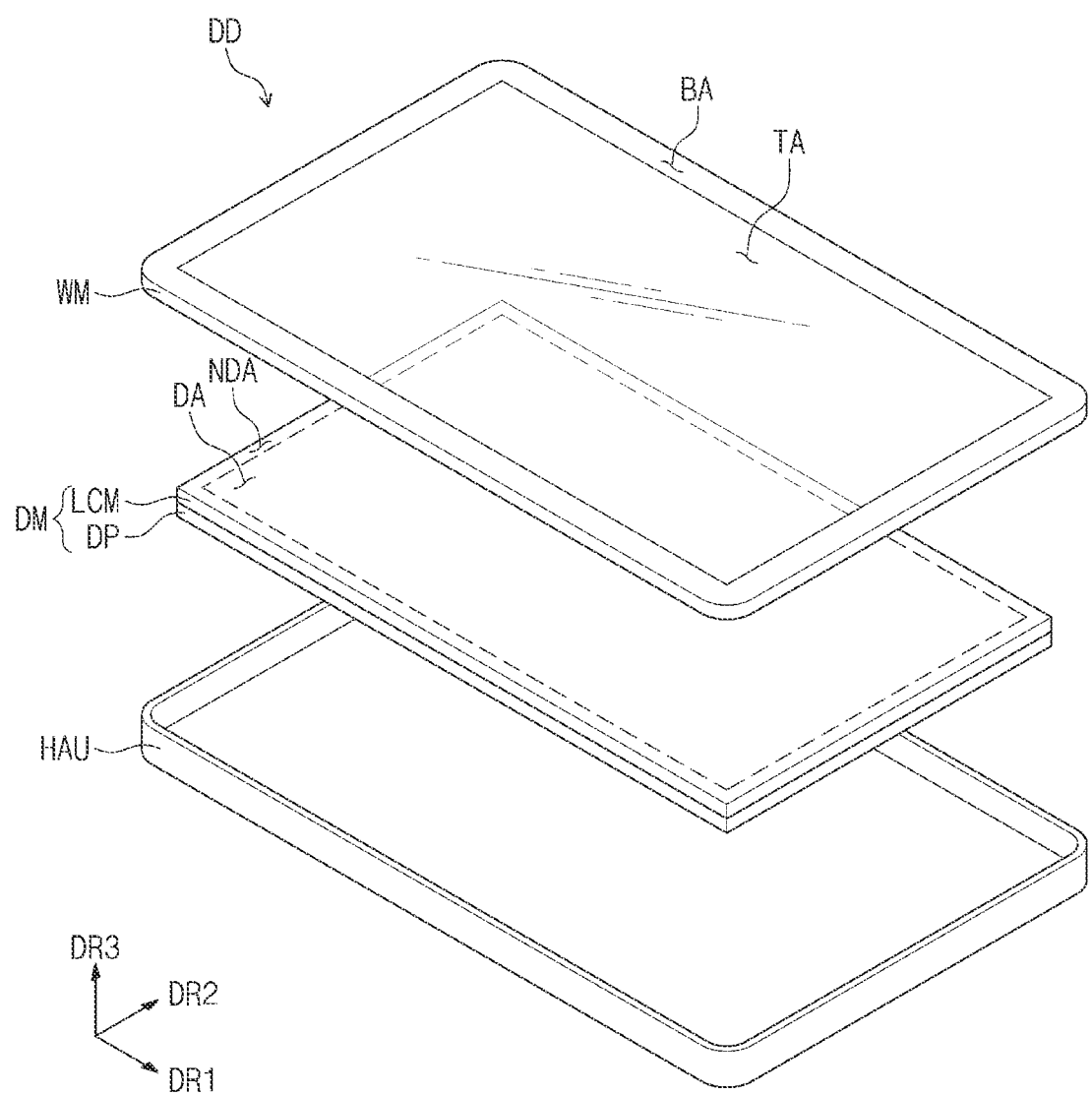
FIG. 2 is an exploded schematic perspective view of a display device according to an embodiment of the disclosure.

FIG. 1 is a schematic perspective view of a display device according to an embodiment of the disclosure. FIG. 2 is an exploded schematic perspective view of a display device according to an embodiment of the disclosure.

A display device DD may be a device which is activated according to an electrical signal, and which displays images. The display device DD may include various embodiments which provide images to a user, and for example, the display device DD may be a large-sized device such as a television and an external billboard, as well as a small-and-medium-sized device such as a monitor, a mobile phone, a tablet computer, a navigation system unit, and a game console. The embodiments of the display device DD are examples, and the display device DD is not limited thereto.

Referring to FIG. 1, the display device DD may have a rectangular shape which has long sides extended in a first direction DR1, and short sides extended in a second direction DR2 in a plan view. However, embodiments of the disclosure are not limited thereto, and the display device DD may have various shapes such as a circular shape and a polygonal shape.

The display device DD may display an image IM in a third direction DR3 though a display surface IS parallel to a plane defined by the first direction DR1 and the second direction DR2. The third direction DR3 may substantially be parallel to a normal direction of the display surface IS. The display surface IS on which the image IM may be displayed may correspond to a front surface of the display device DD. The image IM may include both a moving image and a still image. In FIG. 1, as an example of the image IM, icon images are illustrated.

In an embodiment, a front surface (or upper surface) and a back surface (or lower surface) of each member or unit may be defined based on a direction in which the image IM may be displayed. The front surface and the back surface may oppose each other in the third direction DR3, and the normal direction of each of the front surface and the back surface may be parallel to the third direction DR3. A separation distance between the front surface and the back surface which may be defined along the third direction DR3 may correspond to the thickness of a member (or unit). In the disclosure, "in a plan view" may be defined as a state viewed in the third direction DR3. In the disclosure, "in a cross-sectional view" may be defined as a state viewed in the first direction DR1 or the second direction DR2. Directions indicated by the first to third directions DR1, DR2, and DR3 are a relative concept, and may be converted to different directions.

The display surface IS of the display device DD may include a display portion D-DA and a non-display portion D-NDA.

The display portion D-DA may be a portion in which the image IM is displayed on the front surface of the display device DD, and a user may visually recognize the image IM through the display portion D-DA. An embodiment illustrates the display portion D-DA having a quadrangular shape in a plan view, but the display portion D-DA may have various shapes depending on a design of the display device DD.

The non-display portion D-NDA may be a portion in which the image IM may not be displayed on the front surface of the display device DD. The non-display portion D-NDA may be a portion which has a predetermined or selectable color and which blocks light.

The non-display portion D-NDA may be adjacent to the display portion D-DA. For example, the non-display portion D-NDA may be disposed on an outer side of the display portion D-DA and surround the display portion D-DA. However, this is only an example, and the non-display portion D-NDA may be adjacent to only a side of the display portion D-DA, or may be disposed on the side surface, not the front surface, of display device DD, but embodiments of the disclosure are not limited thereto, and the non-display portion D-NDA may be omitted.

The display device DD of an embodiment may sense an external input applied from the outside. The external input may have various forms such as pressure, temperature, and light provided from the outside.

Referring to FIG. 2, the display device DD may include a window WM, a display module DM, and an external case HAU. The display module DM may include a display panel DP, and a light control member LCM disposed on the display panel DP.

The window WM and the external case HAU may be physically connected to configure the appearance of the display device DD, and to provide an internal space in which components of the display device DD, such as the display module DM, may be accommodated.

The window WM may be disposed on the display module DM. The window WM may protect the display module DM from an external impact. The front surface of the window WM may correspond to the above-described display surface IS of the display device DD. The front surface of the window WM may include a transmissive region TA and a bezel region BA.

The transmissive region TA of the window WM may be an optically transparent region. The window WM may transmit an image provided by the display module DM through the transmissive region TA, and a user may visually recognize the corresponding image. The transmissive region TA may correspond to the display portion D-DA of the display device DD.

As used herein, when "a region/portion corresponds to a region/portion," it means that "they overlap each other," and it is not limited to having the same area and/or the same shape.

The window WM may include an optically transparent insulation material. The window WM may further include functional layers such as an anti-fingerprint layer, a phase control layer, and a hard coating layer disposed on an optically clear substrate.

The bezel region BA of the window WM may be provided as a region in which a material having a predetermined or selectable color is deposited, coated, or printed on a clear substrate. The bezel region BA of the window WM may prevent a component of the display module DM disposed overlapping the bezel region BA from being visually recognized from the outside. The bezel region BA may correspond to the non-display portion D-NDA of the display device DD.

The display module DM may be disposed below a lower portion of the window WM. The display module DM may display an image according to an electrical signal. The display module DM may include a display region DA and a non-display region NDA.

The display region DA may be a region activated by an electrical signal. The display region DA may be a region from which an image provided by the display module DM is emitted. The display region DA of the display module DM may correspond to the above-described transmissive region TA. An image generated in the display region DA may be visually recognized from the outside through the transmissive region TA.

The non-display region NDA may be adjacent to the display region DA. For example, the non-display region NDA may surround the display region DA.

The non-display region NDA may be a region in which a circuit or a driving line for driving elements disposed in the display region DA, various signal lines for providing an electrical signal, and pads may be disposed. The non-display region NDA of the display module DM may correspond to the bezel region BA of the window WM, and the bezel region BA may prevent components of the display module DM disposed in the non-display region NDA from being visually recognized from the outside.

The display panel DP according to an embodiment may be a light emission type display panel, but is not particularly limited thereto. For example, the display panel DP may be an organic light emission display panel, an inorganic light emission display panel or a quantum dot light emission display panel. A light emission layer of the organic light emission display panel may include an organic light emission material, and a light emission layer of the inorganic light emission display panel may include an inorganic light emission material. A light emission layer of the quantum dot light emission display panel may include a quantum dot, a quantum load, and the like. Hereinafter, the display panel DP will be described as being an organic light emission display panel.

The light control member LCM may be disposed on the display panel DP. The light control member LCM may be directly disposed on the display panel DP. In the disclosure, 'being directly disposed' may mean that a separate adhesive member is not disposed between components, and the components are formed through a continuous process. For example, the light control member LCM may be formed through a continuous process on a base surface provided by the display panel DP. As a result, the thickness of the display module DM may be reduced.

The light control member LCM may convert the wavelength of light provided from the display panel DP, or may selectively transmit light provided from the display panel DP. Also, the light control member LCM may prevent the reflection of external light incident from the outside of the display device DD.

The external case HAU may be disposed in a lower portion of the display module DM to accommodate the display module DM. The external case HAU may absorb impacts applied to the display module DM from the outside, and prevent foreign substances/moisture and the like from penetrating into the display module DM to protect the display module DM. The external case HAU of an embodiment may be provided in the form in which multiple housing members are coupled to each other.

The display device DD may further include an input sensing module, and the input sensing module may obtain coordinate information of an external input applied from the outside of the display device DD.

Figure 3:
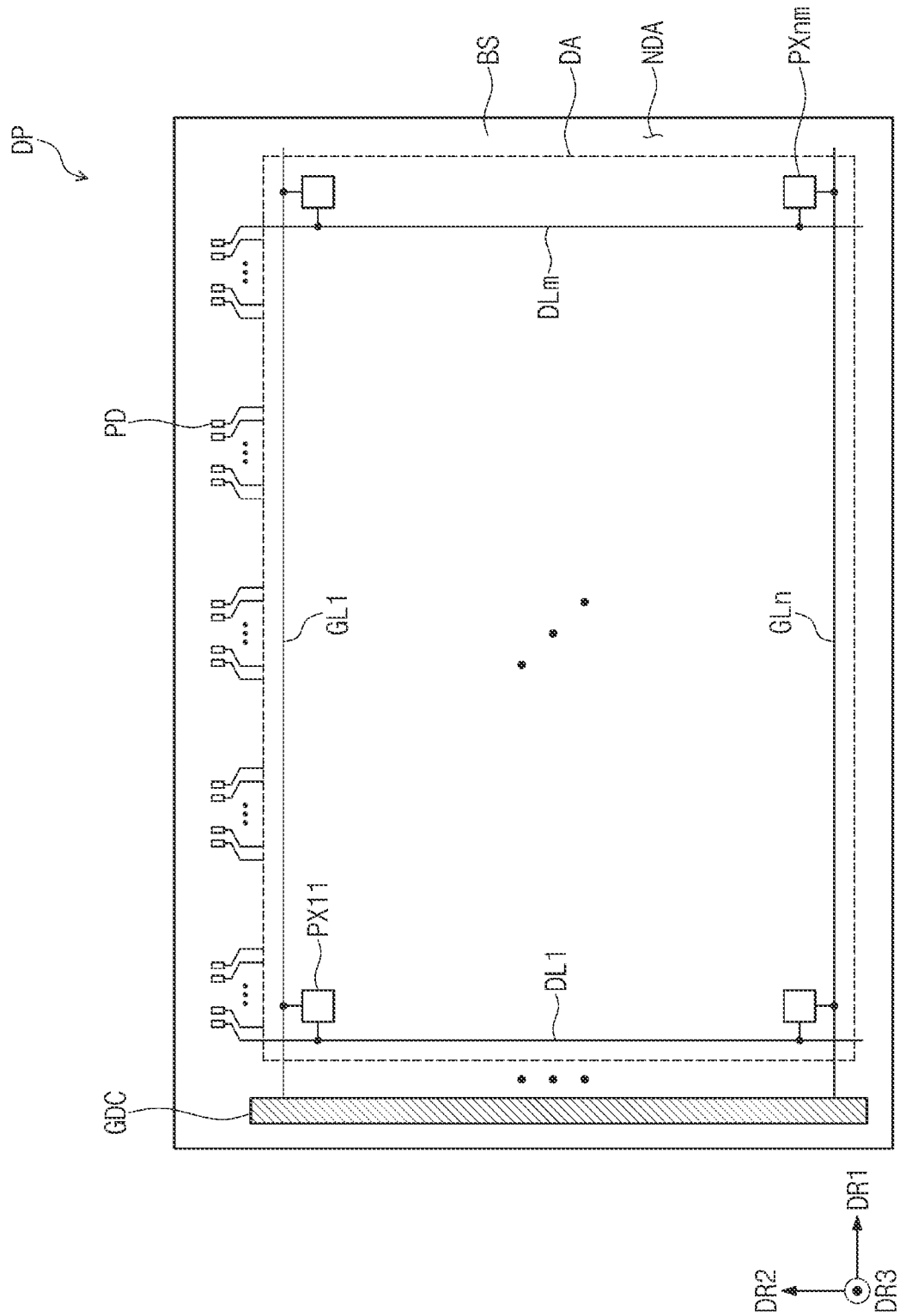
FIG. 3 is a schematic plan view of a display panel according to an embodiment of the disclosure.

FIG. 3 is a schematic plan view of a display panel according to an embodiment of the disclosure.

Referring to FIG. 3, the display panel DP may include a base layer BS which provides a base surface on which components of the display panel DP are disposed. The base layer BS of the display panel DP may include the display region DA and the non-display region NDA.

The display panel DP may include pixels PX11 to PXnm, signal lines GL1 to GLn and DL1 to DLm which may be electrically connected to the pixels PX11 to PXnm, a driving circuit GDC, and pads PD.

Each of the pixels PX11 to PXnm may include a pixel driving circuit composed of a light emission element and transistors (e.g., a switching transistor, a driving transistor, etc.) connected to the light emission element. The pixels PX11 to PXnm may emit light in correspondence to an electrical signal applied to the pixels PX11 to PXnm. FIG. 3 illustrates the pixels PX11 to PXnm arranged in a matrix form, but the arrangement form of the pixels PX11 to PXnm is not limited thereto.

The signal lines GL1 to GLn and DL1 to DLm may include gate lines GL1 to GLn and data lines DL1 to DLm.

Each of the pixels PX11 to PXnm may be connected to a corresponding gate line among the gate lines GL1 to GLn and to a corresponding data line among the data lines DL1 to DLm. Depending on the configuration of a circuit which drives the pixels PX11 to PXnm, more types of signal lines may be provided in the display panel DP.

The driving circuit GDC may include a gate driving circuit. The gate driving circuit generates gate signals, and may sequentially output the gate signals to the gate lines GL1 to GLn. The gate driving circuit may further output another control signal to the pixel driving circuit of the pixels PX11 to PXnm.

The pads PD may be arranged along one direction on the non-display region NDA. The pads PD may be portions connected to a circuit board. Each of the pads PD may be connected to a corresponding signal line among the signal lines GL1 to GLn and DL1 to DLm, and may be connected to a corresponding pixel through the signal line.

Figure 4:
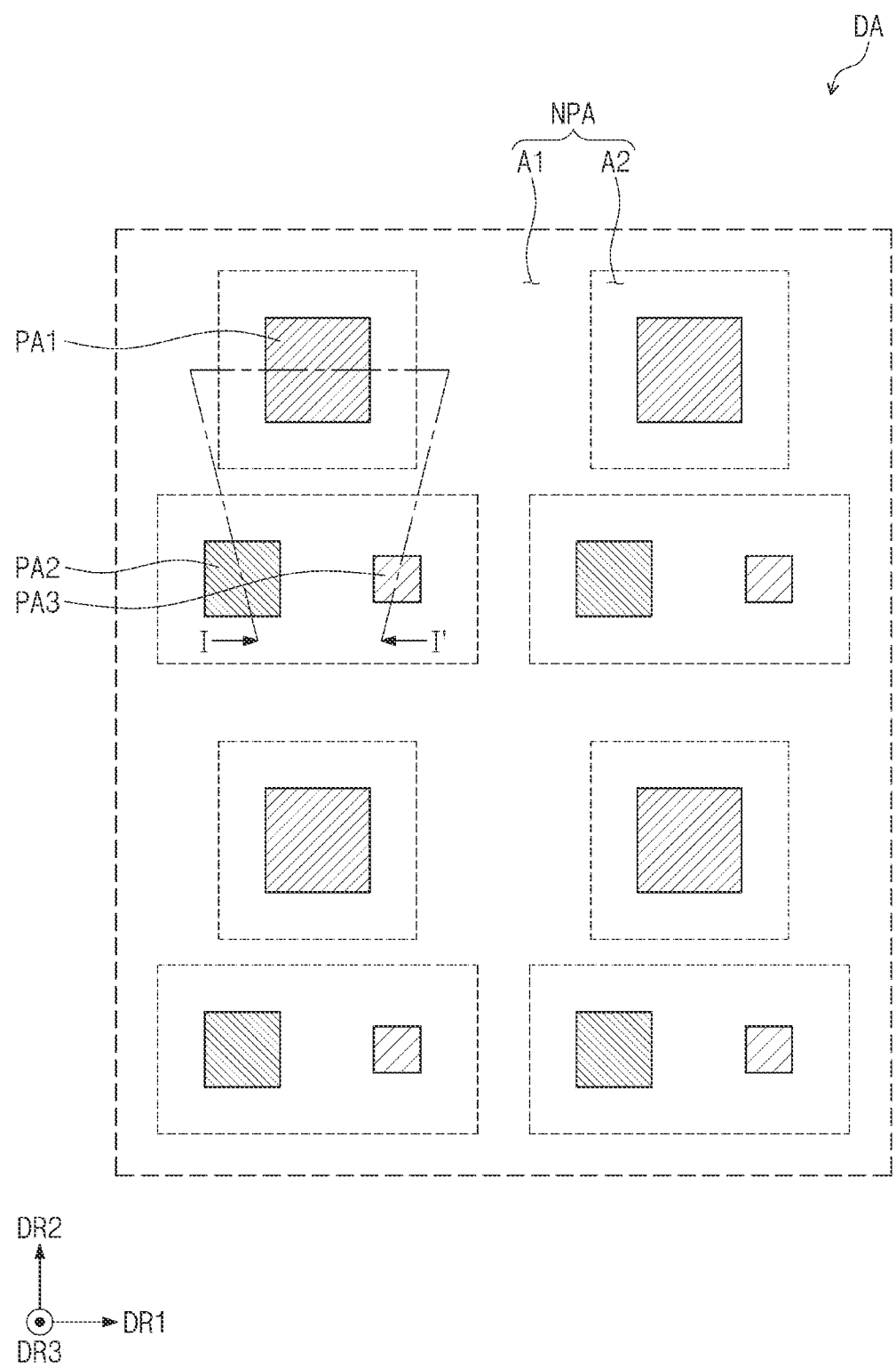
FIG. 4 is a schematic plan view of an enlarged portion of a display region of a display module according to an embodiment of the disclosure.

FIG. 4 is a schematic plan view of an enlarged portion of a display region of a display module according to an embodiment of the disclosure.

Referring to FIG. 4, the display region DA may include pixel regions PA1, PA2, and PA3 and a peripheral region NPA surrounding the pixel regions PA1, PA2, and PA3.

Hereinafter, in the disclosure, for the convenience of explanation, the pixel regions PA1, PA2, and PA3 and the peripheral region NPA are described as regions divided in the base layer BS, but substantially, the pixel regions PA1, PA2, and PA3 may correspond to the area of pixel openings OP-BM1 defined in a partition wall or bank portion BM to be described later in FIG. 5A, and the peripheral region NPA may be defined as other regions of the display region DA except for the pixel regions PA1, PA2, and PA3.

The pixel regions PA1, PA2, and PA3 may correspond to regions from which light provided from light emission elements is emitted. The pixel regions PA1, PA2, and PA3 may include first to third pixel regions PA1, PA2, and PA3. The first to third pixel regions PA1, PA2, and PA3 may be distinguished according to the color of light emitted toward the outside of the display module DD (see FIG. 2).

The first to third pixel regions PA1, PA2, and PA3 may provide first to third color lights which have different colors from each other. In an embodiment, a source light and the third color light may have the same color. For example, the first color light may be green light, the second color light may be red light, and the third color light may be blue light. However, examples of the first to third color lights are not limited to the above examples.

The peripheral region NPA sets boundaries of the first to third pixel regions PA1, PA2, and PA3, and may prevent color mixing between the first to third pixel regions PA1, PA2, and PA3. According to an embodiment, the peripheral region NPA may include a first region A1 and a second region A2 which are distinguished according to a laminate structure of a color filter layer CFL (see FIG. 5A) to be described later. A detailed description thereof will follow.

Multiple of each of the first to third pixel regions PA1, PA2, and PA3 may be provided, and be repeatedly disposed while having a predetermined or selectable arrangement form in the display region DA. The first pixel regions PA1 arranged along the first direction DR1 may be defined as a first row, and the second pixel regions PA2 and the third pixel regions PA3 arranged along the first direction DR1 may be defined as a second row. In the second row, the second pixel regions PA2 and the third pixel regions PA3 may be alternately arranged with each other along the first direction DR1.

Multiple of each of the first row and the second row may be provided and may be arranged along the second direction DR2. At least some of the first rows and the second rows may be alternately arranged with each other along the second direction DR2. In an embodiment, a virtual axis connecting centers of the first pixel regions PA1 arranged along the second direction DR2 may be positioned between the second pixel region PA2 and the third pixel region PA3.

In an embodiment, among the first to third pixel regions PA1, PA2, and PA3, one first pixel region PA1, one second pixel region PA2, and one third pixel region PA3 which are disposed adjacent to each other may be defined as one pixel group. Multiple pixel groups may be provided, and pixel groups may be arranged spaced apart from each other in the first and second directions DR1 and DR2. In one pixel group, one second pixel region PA2 and one third pixel region PA3 may be disposed adjacent to each other while being spaced apart in the first direction DR1, and one first pixel region PA1 may be disposed in a diagonal direction of each of the second pixel region PA2 and the third pixel region PA3 included in the same pixel group. For example, a virtual axis crossing the center of the first pixel region PA1 and extended in the second direction DR2 may be disposed between the second pixel region PA2 and the third pixel region PA3.

FIG. 4 illustrates the arrangement form of the first to third pixel regions PA1, PA2, and PA3, but the first to third pixel regions PA1, PA2, and PA3 may be arranged in various forms without being limited thereto.

The first to third pixel regions PA1, PA2, and PA3 may have various shapes in a plan view. For example, the first to third pixel regions PA1, PA2, and PA3 may have shapes of a polygon, a circle, an oval, or the like. The first to third pixel regions PA1, PA2, and PA3 may have the same shape as each other in a plan view. However, embodiments of the disclosure are not limited thereto, and at least some of the first to third pixel regions PA1, PA2, and PA3 may have different shapes from each other. FIG. 4 illustrates the first to third pixel regions PA1, PA2, and PA3 having a quadrangular shape in a plan view.

At least some of the first to third pixel regions PA1, PA2, and PA3 may have different areas in a plan view. According to an embodiment, the area of the second pixel region PA2 emitting red light may be less than the area of the first pixel region PA1 emitting green light, and greater than the area of the third region PA3 emitting blue light. However, the relationship between large and small areas of the first to third pixel regions PA1, PA2, and PA3 according to the color of emitted light is not limited thereto, and may vary according to the design of the display module DM (see FIG. 2).

Also, without being limited thereto, the first to third pixel regions PA1, PA2, and PA3 may have the same area in a plan view. FIG. 4 illustrates the first to third pixel regions PA1, PA2, and PA3 having different areas from each other in a plan view.

The shapes, areas, arrangements, and the like of the first to third pixel regions PA1, PA2, and PA3 of the display module DM (see FIG. 2) of the disclosure may be designed in various ways in accordance with the color of emitted light, or the shape and configuration of the display module DM (see FIG. 2), and are not limited to an embodiment illustrated in FIG. 4.

Figure 5A:
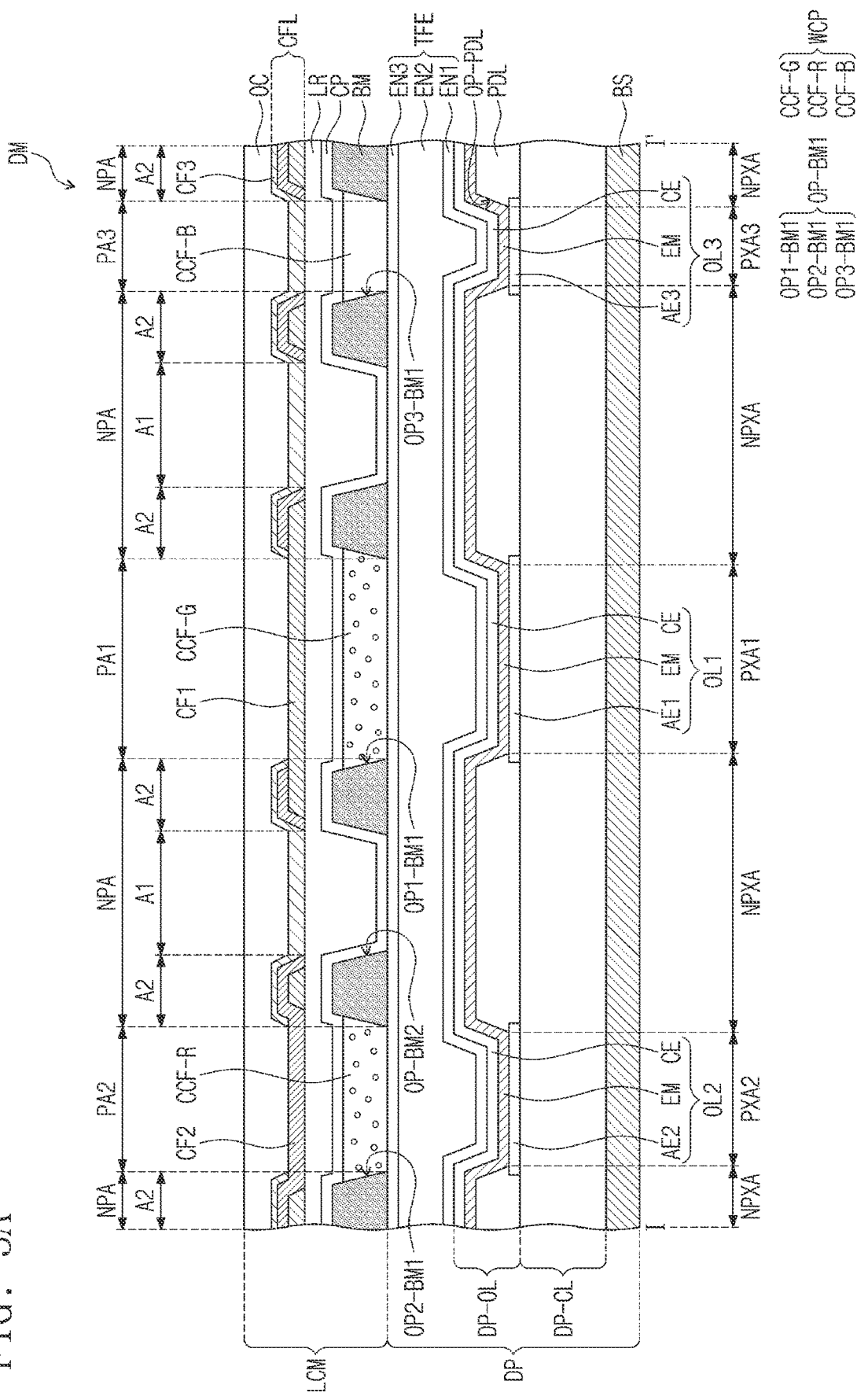
FIG. 5A is a schematic cross-sectional view of a display module according to an embodiment of the disclosure taken along line I-I' of FIG. 4.
Figure 5B:
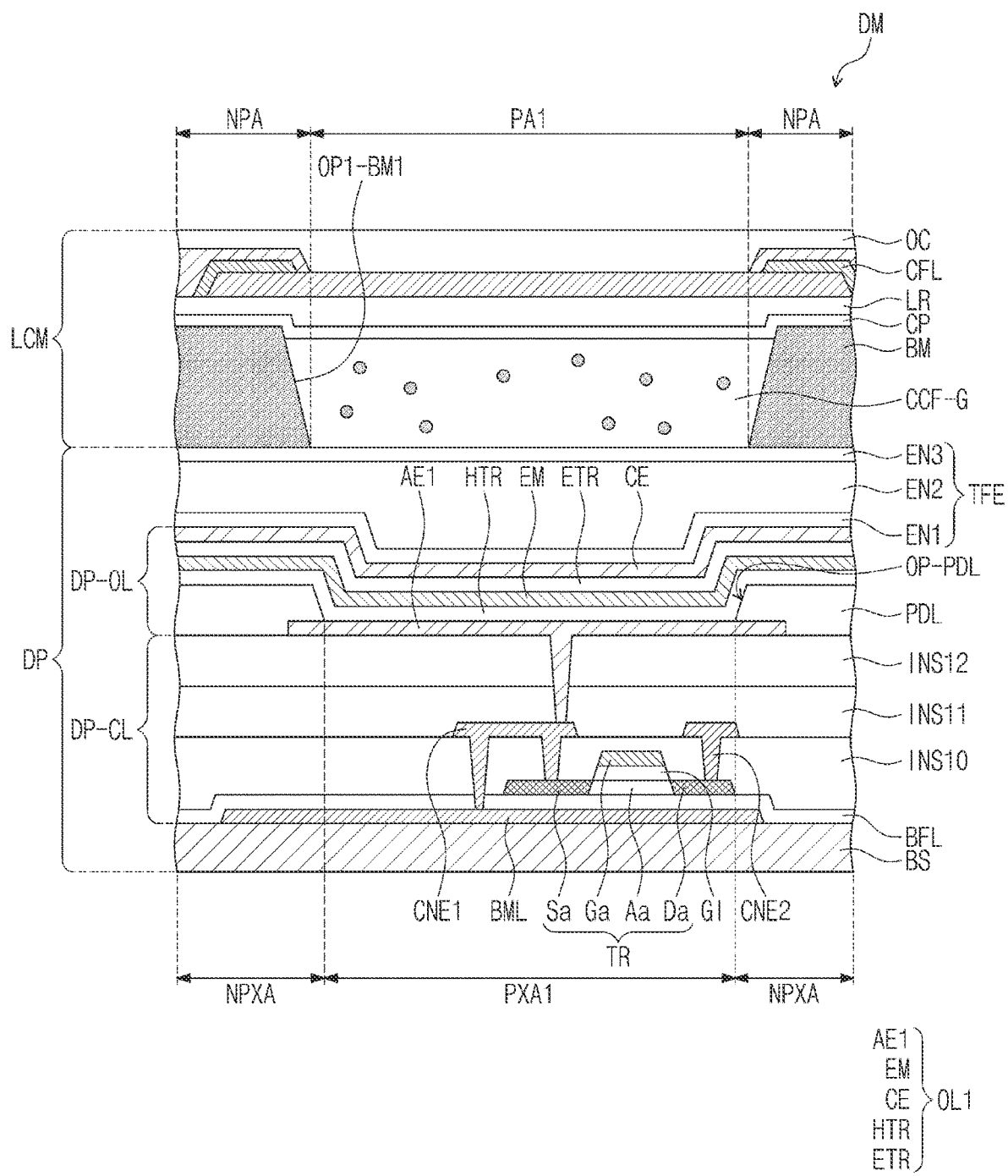
FIG. 5B is a schematic cross-sectional view of a display module according to an embodiment of the disclosure.

FIG. 5A is a schematic cross-sectional view of a display module according to an embodiment of the disclosure taken along line I-I' of FIG. 4. FIG. 5B is a schematic cross-sectional view of a display module according to an embodiment of the disclosure. FIG. 5A illustrates a cross-section of the display module DM corresponding to the first to third pixel regions PA1, PA2, and PA3. FIG. 5B illustrates an enlarged cross-sectional view of the display module DM corresponding to the first pixel region PA1 among the first to third pixel regions PA1, PA2, and PA3.

Referring to FIG. 5A and FIG. 5B, the display module DM according to an embodiment may include the display panel DP and the light control member LCM. The display panel DP may include the base layer BS, a circuit layer DP-CL, a display element layer DP-OL, and an encapsulation layer TFE.

The base layer BS may provide a base surface on which the circuit layer DP-CL may be disposed. The base layer BS may include a glass substrate, a polymer substrate, an organic/inorganic composite material substrate, or the like. The base layer BS may have a single-layered or multi-layered structure.

The circuit layer DP-CL may be disposed on the base layer BS. The circuit layer DP-CL may include at least one insulation layer, a conductive pattern, and a semiconductor pattern. In a manufacturing step of the display panel DP, an insulation layer, a semiconductor layer, and a conductive layer may be formed on the base layer BS by a method such as coating, deposition, and the like, and thereafter, the insulation layer, the semiconductor layer, and the conductive layer may be selectively patterned by a photolithography method to form the insulation layer, the semiconductor pattern, and the conductive pattern of the circuit layer DP-CL.

As illustrated in FIG. 5B, the circuit layer DP-CL according to an embodiment may include a light blocking pattern BML, a transistor TR, connection electrodes CNE1 and CNE2, an insulation pattern GI, and first to third insulation layers INS10, INS11, and INS12.

The light blocking pattern BML may be disposed on the base layer BS. The light blocking pattern BML may overlap the transistor TR. The light blocking pattern BML may include a metal. A signal line may be disposed on the same layer as the layer on which the light-blocking pattern BML may be disposed.

The circuit layer DP-CL may further include a buffer layer BFL disposed on the base layer BS. The buffer layer BFL may cover the light blocking pattern BML. The buffer layer BFL may improve the coupling force between the base layer BS and a semiconductor pattern. The buffer layer BFL may include an inorganic substance.

The semiconductor pattern of the transistor TR may be disposed on the buffer layer BFL. The semiconductor pattern may have different electrical properties depending on whether or not the semiconductor pattern is doped. The semiconductor pattern may include a first region having a high conductivity rate and a second region having a low conductivity rate. The first region may be doped with an N-type dopant or a P-type dopant. A P-type transistor may include a doped region which has been doped with the P-type dopant, and an N-type transistor may include a doped region which has been doped with the N-type dopant. The second region may be a non-doped region or a region doped to a concentration lower than that of the first region. The semiconductor pattern of the transistor TR may include a source region Sa, a drain region Da, and a channel region Aa.

An insulation pattern GI may be disposed on the semiconductor pattern of the transistor TR. The insulation pattern GI may be formed by forming an insulation layer on the semiconductor pattern of the transistor TR, and patterning the insulation layer. A gate electrode Ga may be disposed on the insulation pattern GI. The gate electrode Ga may be used as a mask in a process of forming the insulation pattern GI. The gate electrode Ga may overlap the channel region Aa.

The first to third insulation layers INS10, INS11, and INS12 may be disposed on the buffer layer BFL. Each of the first to third Insulation layers INS10, INS11, and INS12 may include at least one inorganic layer or at least one organic layer. The first insulation layer INS10 is disposed on the buffer layer BFL, and may cover the gate electrode Ga.

The connection electrodes CNE1 and CNE2 may include first and second connection electrodes CNE1 and CNE2 which may be disposed on the first insulation layer INS10. The first connection electrode CNE1 may be connected to the source region Sa of the transistor TR through a contact-hole passing through the first insulation layer INS10. In an embodiment, the first connection electrode CNE1 may also be connected to the light blocking pattern BML through a contact-hole passing through the first insulation layer INS10 and the buffer layer BFL.

The second connection electrode CNE2 may be connected to the drain region Da of the transistor TR through a contact-hole passing through the first insulation layer INS10. The second connection electrode CNE2 may be extended on a plane and be connected to another transistor or line.

The second and third insulation layers INS11 and INS12 may be disposed on the first insulation layer INS10 to cover the connection electrodes CNE1 and CNE2. The second and third insulation layers INS11 and INS12 may have a through-hole defined thereon which exposes a portion of the first connection electrode CNE1, and the first connection electrode CNE1 may be connected to first electrodes AE1, AE2, and AE3 of respective light emission elements OL1, OL2, and OL3 disposed on the third insulation layer INS12. In an embodiment, the third insulation layer INS12 includes an organic film, and may provide a flat upper surface.

The display element layer DP-OL may be disposed on the circuit layer DP-CL. The display element layer DP-OL may include the light emission elements OL1, OL2, and OL3, and a pixel definition film PDL. The light emission elements OL1, OL2, and OL3 may each be connected to the transistor TR of the circuit layer DP-CL and driven, and may provide a source light (or a third light) toward the light control member LCM in the display region DA.

In an embodiment, the light emission elements OL1, OL2, and OL3 may include an organic light emission element, an inorganic light emission element, a quantum dot light emission element, a micro-LED light emission element, or a nano-LED light emission element. However, an embodiment of disclosure is not limited thereto, and the light emission elements OL1, OL2, and OL3 may include various embodiments as long as light may be generated according to an electrical signal or the amount of light may be controlled.

The light emission elements OL1, OL2, and OL3 may include first to third light emission elements OL1, OL2, and OL3. The first to third light emission elements OL1, OL2, and OL3 may respectively include first electrodes AE1, AE2, and AE3, a light emission unit EM, and a second electrode CE sequentially laminated.

The first electrodes AE1, AE2, and AE3 may be disposed on the third insulation layer INS12. The first electrodes AE1, AE2, and AE3 may be provided as multiple patterns. The first electrodes AE1, AE2, and AE3 may be spaced apart from each other.

The pixel definition film PDL may be disposed on the third insulation layer INS12. On the pixel definition film PDL, light emission openings OP-PDL may be defined. Each of the light emission openings OP-PDL may expose at least a portion of a corresponding first electrode among the first electrodes AE1, AE2, and AE3. Substantially, each of the light emission regions PXA1, PXA2, and PXA3 may correspond to the area of a corresponding light emission opening OP-PDL. A region in which the pixel definition film PDL may correspond to a non-light emission region NPXA.

A region of the first electrode AE1 of the first light emission element OL1 exposed from the pixel definition film PDL may be defined as a first light emission region PXA1. A region of the first electrode AE2 of the second light emission element OL2 exposed from the pixel definition film PDL may be defined as a second light emission region PXA2. A region of the first electrode AE3 of the third light emission element OL3 exposed from the pixel definition film PDL may be defined as a third light emission region PXA3.

The light emission unit EM may be disposed on the first electrodes AE1, AE2, and AE3 and the pixel definition film PDL. The light emission units EM of the first to third light emission elements OL1, OL2, and OL3 may be connected to each other and be provided in the shape of a single body. For example, the light emission unit EM may be provided in the form of a common layer.

The light emission unit EM may include a functional layer which controls a light emission layer and an electron or a hole. The light emission unit EM may include an organic light emission material, an inorganic light emission material, a quantum dot, a quantum rod, or the like. The light emission unit EM may generate a source light. For example, the source light may be a third light, and the third light may be blue light. According to an embodiment, the light emission unit EM may have a tandem structure including multiple light emission layers laminated on the first electrodes AE1, AE2, and AE3.

However, embodiments of the disclosure are not limited thereto, and the light emission unit EM may be provided in the form of a pattern disposed corresponding to the light emission openings PDL-OP, and the light emission unit EM in the form of a pattern may provide source light having different colors from each other depending on the first to third light emission elements.

The second electrode CE may be disposed on the light emission unit EM. The second electrode CE of each of the first to third light emission elements OL1, OL2, and OL3 may be connected to each other and be provided in the shape of a single body. For example, the second electrode CE may be provided in the form of a common layer. A common voltage may be provided to the second electrode CE.

As illustrated in FIG. 5B, each of the first to third light emission elements OL1, OL2, and OL3 may further include a hole control layer HTR and an electron control layer ETR.

The hole control layer HTR may be disposed between the first electrode AE1 and the light emission unit EM. The hole control layer HTR may be commonly disposed in multiple pixels. The hole control layer HTR may include at least one of a hole transport layer and a hole injection layer.

The electron control layer ETR may be disposed between the light emission unit EM and the second electrode CE. The electron control layer ETR may be commonly disposed in multiple pixels. The electron control layer ETR may include at least one of an electron transport layer and an electron injection layer.

The encapsulation layer TFE may be disposed on the display element layer DP-OL and encapsulate the light emission elements OL1, OL2, and OL3. The encapsulation layer TFE may have a multi-layered structure in which an inorganic layer/organic layer may be repeated.

In an embodiment, the encapsulation layer TFE may include a first inorganic layer EN1, an organic layer EN2 disposed on the first inorganic layer EN1, and a second inorganic layer EN3 disposed on the organic layer EN2. The first and second inorganic layers EN1 and EN3 may protect the light emission elements OL1, OL2, and OL3 from external moisture, and the organic layer EN2 may prevent imprint defects of the light emission elements OL1, OL2, and OL3 caused by foreign substances introduced during a manufacturing process.

The light control member LCM may be directly disposed on the display panel DP. In an embodiment, the light control member LCM may include the bank portion BM, a light control unit WCP, a capping layer CP, a low refractive layer LR, the color filter layer CFL, and a planarization layer OC.

The bank portion BM may be disposed on the encapsulation layer TFE. The bank portion BM may come in contact with an insulation film (e.g., the second inorganic layer EN3) disposed in the uppermost portion of the encapsulation layer TFE.

The bank portion BM may overlap the non-light emission region NPXA. In the bank portion BM, the pixel openings OP-BM1 and peripheral openings OP-BM2. The pixel openings OP-BM1 may include first to third pixel openings OP1-BM1, OP2-BM1, and OP3-BM1 respectively corresponding to the first to third light emission elements OL1, OL2, and OL3. The first to third pixel openings OP1-BM1, OP2-BM1, and OP3-BM1 may respectively define the above-described first to third pixel regions PA1, PA2, and PA3. The peripheral openings OP-BM2 may be formed overlapping the non-light emission region NPXA.

The bank portion BM may include a base resin and an additive. The additive may include a coupling agent and/or a photoinitiator. The additive may further include a dispersant. The bank portion BM may include a light transmissive material capable of transmitting a source light.

The light control unit WCP may include first to third light control patterns CCF-G, CCF-R, and CCF-B disposed respectively corresponding to the first to third pixel regions PA1, PA2, and PA3. The third light control pattern CCF-B may be referred to as a transmissive pattern.

The first to third light control patterns CCF-G, CCF-R, and CCF-B may be disposed in the first to third pixel openings OP1-BM1, OP2-BM1, and OP3-BM1 defined in the bank portion BM, and at least some of the first to third light control patterns CCF-G, CCF-R, and CCF-B may change the optical properties of a source light.

In an embodiment, the first light control pattern CCF-G may convert blue light, which may be a source light, into green light. The second light control pattern CCF-R may convert blue light, which may be the source light, into red light. The third light control pattern CCF-B (or the transmissive pattern) may transmit blue light, which may be the source light.

Each of the first and second light control patterns CCF-G and CCF-R may include a base resin and quantum dots dispersed in the base resin. The quantum dots may be particles which convert the wavelength range of the source light.

A core of a quantum dot included in each of the first and second control patterns CCF-G and CCF-R may be selected from a Group II-VI compound, a Group III-VI compound, a Group I-III-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as In2S3 and In2Se3, a ternary compound such as InGaS3 and InGaSe3, or any combination thereof.

The Group I-III-VI compound may be selected from a ternary compound selected from the group consisting of AgInS, AgInS2, CuInS, CuInS2, AgGaS2, CuGaS2 CuGaO2, AgGaO2, AgAlO2, and a mixture thereof, or a quaternary compound such as AgInGaS2 and CuInGaS2.

The Group III-V compound may be selected from the group consisting of a binary compound selected from the group consisting of GaN, GaP, GaAs, GaSb, AN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP or the like may be selected as the Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

At this time, a binary compound, a ternary compound, or a quaternary compound may be present in a particle at a uniform concentration, or may be present in the same particle with a partially different concentration distribution.

A quantum dot may have a core-shell structure including a core and a shell surrounding the core. The quantum dot may have a core/shell structure in which one quantum dot surrounds another quantum dot. The interface between the core and the shell may have a concentration gradient in which the concentration of an element present in the shell becomes lower toward the center.

In an embodiment, the quantum dot may have the above-described core-shell structure including nano-crystals. The shell of the quantum dot may serve as a protection layer to prevent the chemical deformation of the core so as to maintain semiconductor properties, and/or a charging layer to impart electrophoresis properties to the quantum dot. The shell may be a single layer or multi-layers. The interface between the core and the shell may have a concentration gradient in which the concentration of an element present in the shell becomes lower toward the center. Examples of the shell of the quantum dot may include a metal oxide, a non-metal oxide, a semiconductor compound, or a combination thereof.

For example, the metal oxide and the non-metal oxide may include a binary compound such as $SiO_2$, $Al_2O_3$, $TiO2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the materials thereof are not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the material thereof is not limited thereto.

The quantum dot may have a full width of half maximum (FWHM) of a light emission wavelength spectrum of about 45 nm or less, in an embodiment about 40 nm or less, and in another embodiment about 30 nm or less, and color purity or color reproducibility may be improved in the above range. Light emitted through such a quantum dot may be emitted in all directions, so that a wide viewing angle may be improved.

Although the form of the quantum dot is not particularly limited, as an example, a quantum dot in the form of spherical, pyramidal, multi-arm, or cubic nanoparticles, nanotubes, nanowires, nanofibers, nanoplate particles, and the like may be used.

The quantum dot may control the color of emitted light according to the particle size thereof, and accordingly, the quantum dot may have various light emission colors such as blue, red, green, and the like. In case that the above-described light emission layer includes a quantum dot material, the above-described description of the quantum dot may be equally applied to the quantum dot material included in the light emission layer.

The third light control pattern CCF-B may include a base resin, and may further include scattering particles dispersed in the base resin. In an embodiment, the first and second light control patterns CCF-G and CCF-R may also further include scattering particles. The scattering particles may scatter light converted in the light control unit WCP or light passed through the light control unit WCP into various directions, and may improve light conversion efficiency by a quantum dot. The scattering particles may include a titanium oxide ($TiO_2$), a silica-based nano-particle, or the like.

The capping layer CP may be disposed on the light control unit WCP and the bank portion BM. The capping layer CP may include an inorganic substance. The capping layer CP may prevent moisture or foreign substances from penetrating into the light control unit WCP.

The low refractive layer LR may be disposed on the light control unit WCP. The low refractive layer LR may include a low refractive organic film, and may further include scattering particles dispersed in the organic film. The low refractive layer LR may have a refractive index lower than the refractive index of each of the first to third light control patterns CCF-G, CCF-R, and CCF-B.

The low refractive layer LR may be disposed on an upper surface of each of the first to third light control patterns CCF-G, CCF-R, and CCF-B to circulate light into the light control unit WCP, and thus, may improve the light emission efficiency of the display module DM. The low refractive layer LR may be omitted.

The color filter layer CFL may be disposed on the low refractive layer LR. The color filter layer CFL may include first to third color filters CF1, CF2, and CF3. The first to third color filters CF1, CF2, and CF3 may be disposed respectively corresponding to the first to third pixel regions PA1, PA2, and PA3. The first to third color filters CF1, CF2, and CF3 may be formed through deposition and patterning to be disposed corresponding to the first to third pixel regions PA1, PA2, and PA3.

Each of the first to third color filters CF1, CF2, and CF3 may include a base resin, and a pigment or dye dispersed in the base resin. Each of the first to third color filters CF1, CF2, and CF3 may transmit light having a predetermined or selectable wavelength range, and may absorb light having a wavelength range other than the predetermined or selectable wavelength range.

In an embodiment, the first color filter CF1 may transmit green light, and may block red light and blue light. The second color filter CF2 may transmit red light, and may block green light and blue light. The third color filter CF3 may transmit blue light, and may block green light and red light.

In an embodiment, the color filter layer CFL may divide the peripheral region NPA into the first region A1 and the second region A2 according to a laminate relationship of the first to third color filters CF1, CF2, and CF3. The first region A1 may be defined as a region overlapped by only the third color filter CF3 among the first to third color filters CF1, CF2, and CF3. The second region A2 may be defined as a region overlapped by two or more among the first to third color filters CF1, CF2, and CF3. Accordingly, the first region A1 may be referred to as a single-layered region, and the second region A2 may be referred to as a multi-layered region.

According to the disclosure, in the second region A2 of the color filter layer CFL, the first to third color filters CF1, CF2, and CF3 may be disposed overlapping each other along a thickness direction. Accordingly, the overlapped color filters may block light which passes through the peripheral region NPA to prevent color mixing between the first and third pixel regions PA1, PA2, and PA3.

In the first region A1 of the color filter layer CFL, only the third color filter CF3 is disposed to reduce the thickness of a step formed in the second region A2. Accordingly, the degree of planarization of the display module DM may be improved to provide the display device DD (see FIG. 1) with improved reliability. A detailed description of the first to third color filters CF1, CF2, and CF3 will follow.

The planarization layer OC may be disposed on the color filter layer CFL. The planarization layer OC may include an organic layer. The planarization layer OC may include an optically transparent material. The planarization layer OC may be formed by coating an organic layer on the color filters CF1, CF2, and CF3. The planarization layer OC may cover steps between the color filters CF1, CF2, and CF3 of the color filter layer CFL, and may provide a flat upper surface.

Figure 6A:
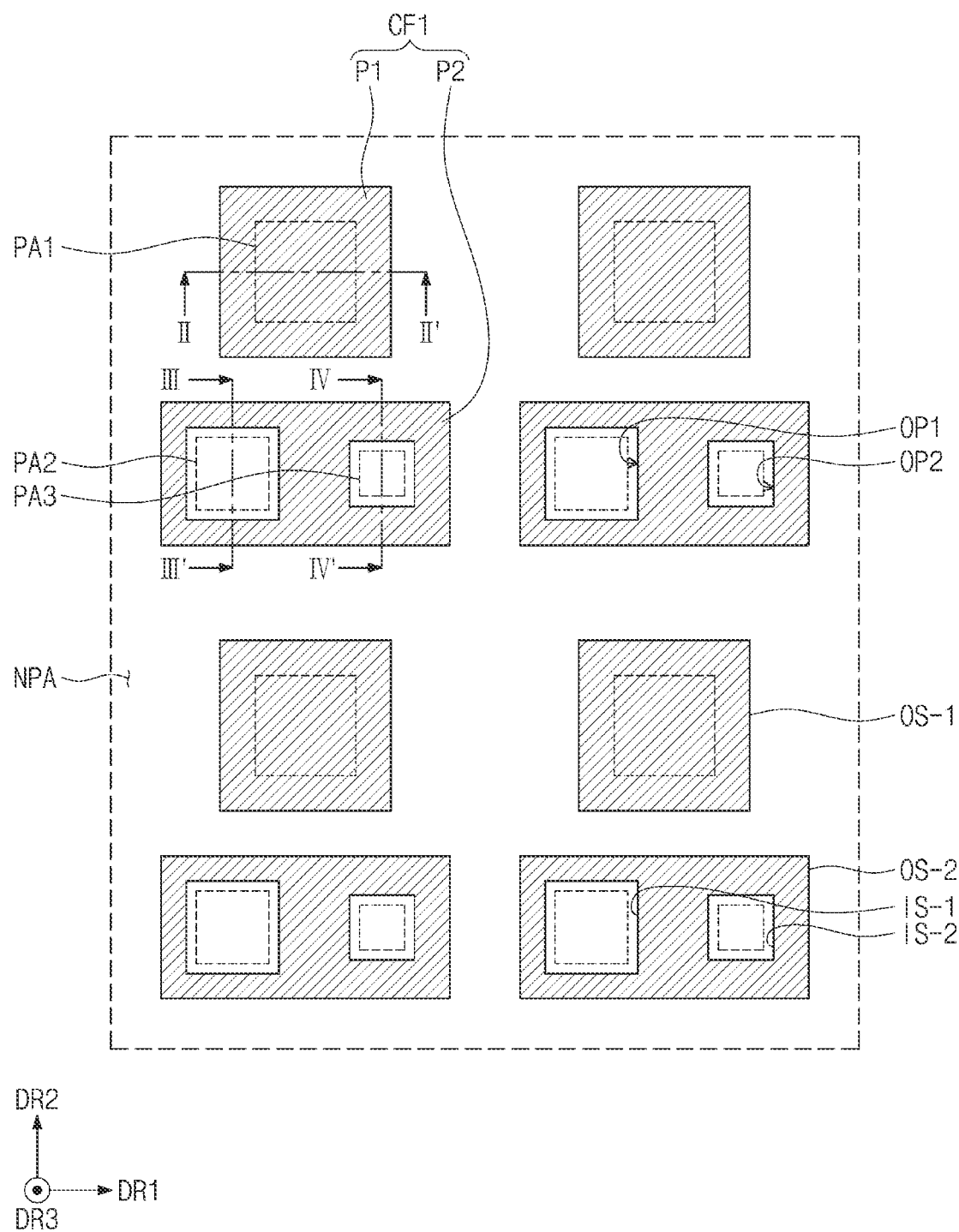
FIG. 6A to FIG. 6C are enlarged schematic plan views of some components of a color filter layer according to an embodiment of the disclosure.
Figure 6B:
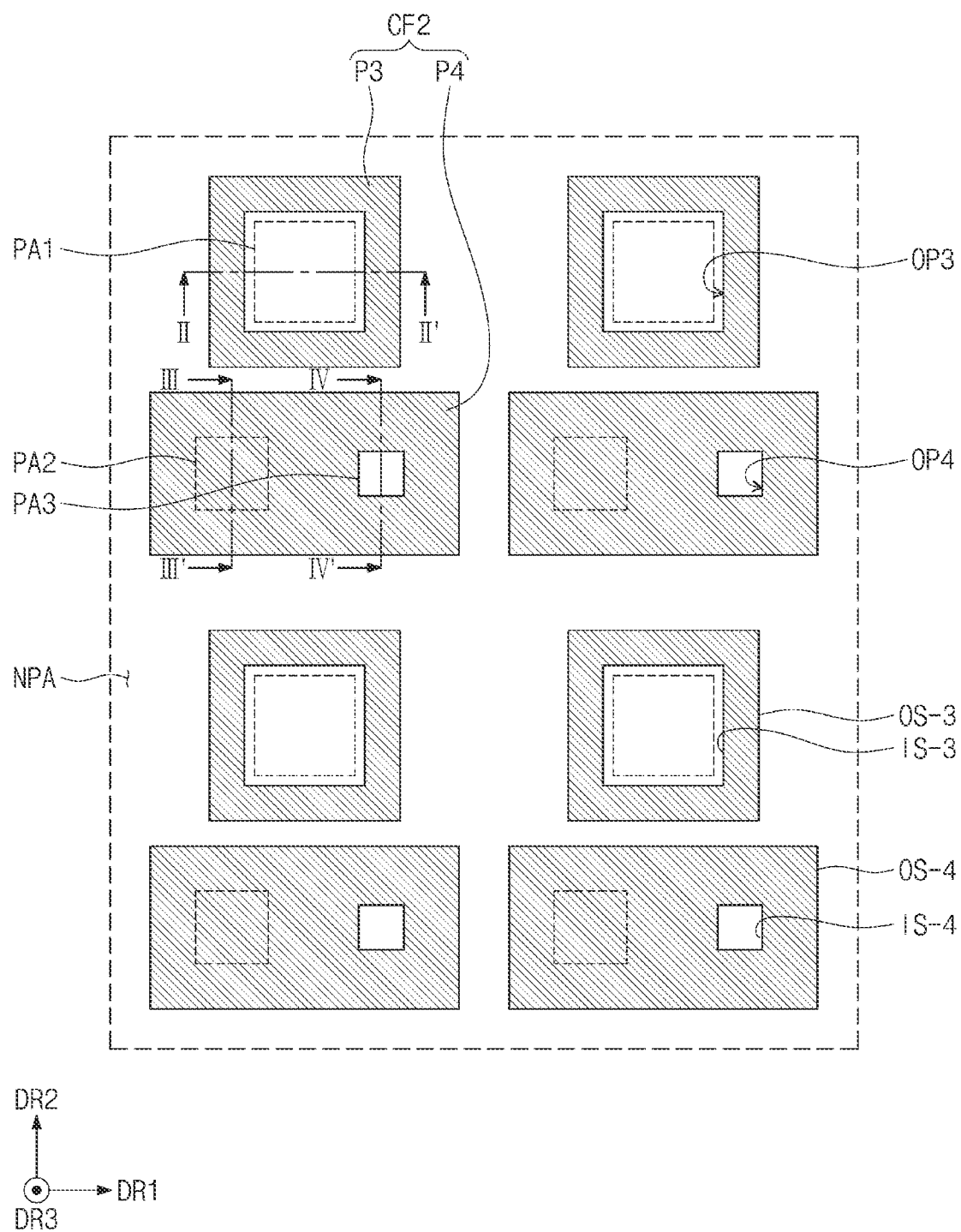
Figure 6C:
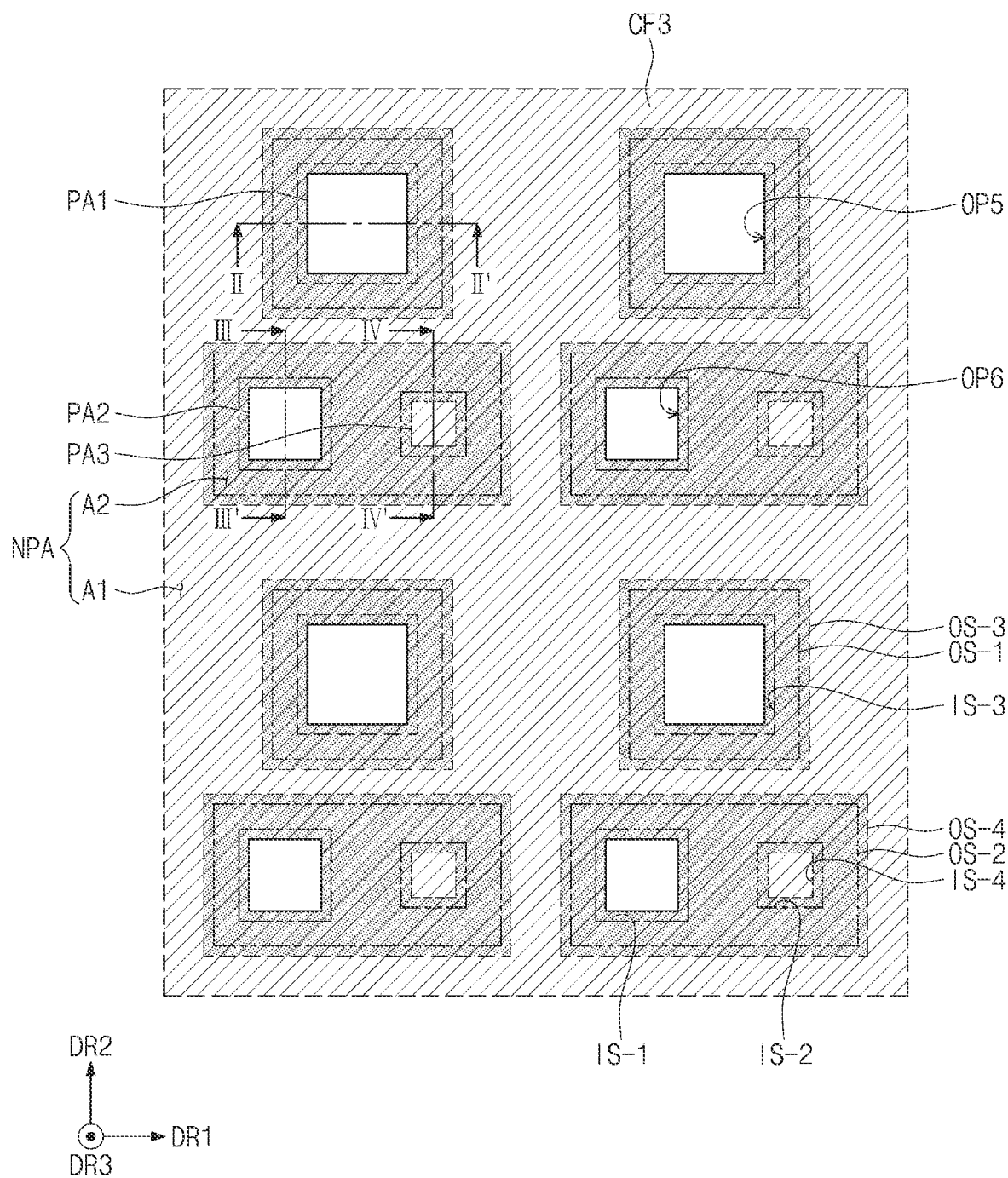

FIG. 6A to FIG. 6C are enlarged schematic plan views of some components of a color filter layer according to an embodiment of the disclosure. FIG. 7A to FIG. 7D are schematic cross-sectional views of a light control unit according to an embodiment of the disclosure taken along line II-IF of FIG. 6A to FIG. 6C. FIG. 7E is a schematic cross-sectional view of a light control unit according to an embodiment of the disclosure taken along line III-III' and IV-IV' of FIG. 6A to FIG. 6C. FIG. 6A illustrates an enlarged plan view of the first color filter CF1, FIG. 6B illustrates an enlarged plan view of the second color filter CF2, and FIG. 6C illustrates an enlarged plan view of the third color filter CF3. FIG. 7A to FIG. 7E are cross-sectional views illustrating steps of forming a color filter layer.

Referring to FIG. 6A, the first color filter CF1 may include first patterns P1 and second patterns P2.

Each of the first patterns P1 may overlap the entire corresponding first pixel region PA1 and a portion of the peripheral region NPA adjacent thereto. The area of each of the first patterns P1 may be greater than the area of the corresponding first pixel region PA1 in a plan view. The first patterns P1 may be arranged spaced apart from each other in the first direction DR1 and the second direction DR2.

The first patterns P1 may have a quadrangular shape in a plan view. For example, an outer surface OS-1 of each of the first patterns P1 may include sides extended in the first direction DR1 and sides extended in the second direction DR2. However, embodiments of the disclosure are not limited thereto, and the shape of the first patterns P1 may be variously modified corresponding to the shape of the first pixel regions PA1, and may be different from the shape of the first pixel regions PA1.

The second patterns P2 may each overlap a portion of the peripheral region NPA adjacent to the second and third pixel regions PA2 and PA3, and may not overlap the first to third pixel regions PA1, PA2, and PA3. The second patterns P2 may be arranged spaced apart from each other in the first direction DR1 and the second direction DR2.

The second patterns P2 may be spaced apart from the first patterns P1. The first patterns P1 and the second patterns P2 may be alternately arranged in the second direction DR2. However, embodiments of the disclosure are not limited thereto, and a direction in which the first and second patterns P1 and P2 are arranged may be variously modified depending on the arrangement of the first to third pixel regions PA1, PA2, and PA3.

The second patterns P2 may each have a first opening OP1 overlapping the entire corresponding second pixel region PA2 and a second opening OP2 overlapping the entire corresponding third pixel region PA3. For example, one second pattern P2 may have one first opening OP1 and one second opening OP2 which respectively overlap the one second pixel region PA2 and the one third pixel region PA3 forming the one pixel group described above with reference to FIG. 4.

The area of the first opening OP1 may be greater than the area of the second pixel region PA2 in a plan view, and the area of the second opening OP2 may be greater than the area of the third pixel region PA3.

The first and second openings OP1 and OP2 may have a quadrangular shape in a plan view. However, embodiments of the disclosure are not limited thereto, and the shapes of the first and second openings OP1 and OP2 may be variously modified corresponding to the shapes of the second and third pixel regions PA2 and PA3, and may be different from the shapes of the second and third pixel regions PA2 and PA3.

The second patterns P2 may each include an outer surface OS-2, an inner surface IS-1 defining the first opening OP1, and an inner surface IS-2 defining the second opening OP2. FIG. 6A illustrates that the outer surface OS-2 of the second pattern P2 includes long sides extended in the first direction DR1 and short sides extended in the second direction DR2 in a plan view, but embodiments of the disclosure are not limited thereto. The shape of the second pattern P2 may be variously modified according to the shape and arrangement form of the first to third pixel regions PA1, PA2, and PA3.

Referring to FIG. 6B, the second color filter CF2 may include third patterns P3 and fourth patterns P4.

The third patterns P3 may each overlap a portion of the peripheral region NPA adjacent to the first pixel region PA1, and may not overlap the first to third pixel regions PA1, PA2, and PA3. The third patterns P3 may be arranged spaced apart from each other in the first direction DR1 and the second direction DR2.

The third patterns P3 may each have a third opening OP3 overlapping the entire corresponding first pixel region PA1. The area of the third opening OP3 may be greater than the area of the corresponding first pixel region PA1 in a plan view.

In an embodiment, the third patterns P3 may each have a quadrangular band shape in a plan view, and the third opening OP3 may have a quadrangular shape corresponding to the shape of the first pixel regions PA1 in a plan view. For example, the third patterns P3 may each include an outer surface OS-3 and an inner surface IS-3 including sides extended in the first direction DR1 and sides extended in the second direction DR2. However, the shapes of the third patterns P3 and the third opening OP3 are not limited thereto.

The fourth patterns P4 may each overlap the entire corresponding second pixel region PA2 and a portion of the peripheral region NPA adjacent to the second and third pixel regions PA2 and PA3, and may not overlap the first and third pixel regions PA1 and PA3. The fourth patterns P4 may be arranged spaced apart from each other in the first direction DR1 and the second direction DR2.

The fourth patterns P4 may be spaced apart from the third patterns P3. The third patterns P3 and the fourth patterns P4 may be alternately arranged in the second direction DR2. However, embodiments of the disclosure are not limited thereto, and a direction in which the third and fourth patterns P3 and P4 are arranged may vary depending on the arrangement of the first to third pixel regions PA1, PA2, and PA3.

The fourth patterns P4 may each have a fourth opening OP4 overlapping entire corresponding third pixel region PA3. The area of the fourth opening OP4 is the same as the area of the third pixel region PA3 in a plan view, and an inner surface IS-4 defining the fourth opening OP4 may be aligned with the boundary of the third pixel region PA3. However, embodiments of the disclosure are not limited thereto, and the area of the fourth opening OP4 may be greater than the area of the third pixel region PA3.

The fourth opening OP4 may have a quadrangular shape corresponding to the shape of the third pixel regions PA3 in a plan view. However, embodiments of the disclosure are not limited thereto, and the shape of the fourth opening OP4 may be variously modified corresponding to the shape of the third pixel regions PA3, and the shape of the fourth opening OP4 may be different from the shape of the third pixel regions PA3.

The fourth patterns P4 may each include an outer surface OS-4 and the inner surface IS-4 defining the fourth opening OP4. FIG. 6B illustrates that the outer surface OS-4 of the fourth pattern P4 includes long sides extended in the first direction DR1 and short sides extended in the second direction DR2 in a plan view, but embodiments of the disclosure are not limited thereto. The shape of the fourth pattern P4 may be variously modified according to the shape and arrangement form of the first to third pixel regions PA1, PA2, and PA3.

Referring to FIG. 6C, the third color filter CF3 may overlap the third pixel region PA3 and at least a portion of the peripheral region NPA. The third color filter CF3 may have a fifth opening OP5 overlapping the entire corresponding first pixel region PA1 and a sixth opening OP6 overlapping the entire corresponding second pixel region PA2.

According to an embodiment, the area of the fifth opening OP5 is the same as the area of the first pixel region PA1 in a plan view, and an inner surface of the third color filter CF3 defining the fifth opening OP5 may be aligned with the boundary of the first pixel region PA1. The area of the sixth opening OP6 is the same as the area of the second pixel region PA2 in a plan view, and an inner surface of the third color filter CF3 defining the sixth opening OP6 may be aligned with the boundary of the second pixel region PA2. At this time, each of the fifth and sixth openings OP5 and OP6 may not overlap the peripheral region NPA. Accordingly, the third color filter CF3 according to an embodiment may overlap all of the peripheral region NPA.

However, embodiments of the disclosure are not limited thereto, and the area of the fifth opening OP5 may be greater than the area of the first pixel region PA1 in a plan view, and the area of the sixth opening OP6 may be greater than the area of the second pixel region PA2. At this time, the third color filter CF3 may overlap all the remaining regions of the peripheral region NPA except for a region overlapping the fifth and sixth openings OP5 and OP6.

According to an embodiment, the third color filter CF3 may not be provided as multiple patterns, unlike the first and second color filters CF1 and CF2. For example, the third color filter CF3 may entirely overlap the peripheral region NPA on an outer side of the fifth opening OP5 and the sixth opening OP6.

In FIG. 6C, for convenience of description, the outer surfaces OS-1 and OS-2 of the respective first and second patterns P1 and P2, and the inner surfaces IS-1 and IS-2 of the second pattern P2 illustrated in FIG. 6A are illustrated with dotted lines. The outer surfaces OS-3 and OS-4 of the respective third and fourth patterns P3, the inner surface IS-3 of the third pattern P3, and the inner surface IS-4 of the fourth pattern P4 illustrated in FIG. 6B are illustrated with dash-dotted lines.

In an embodiment, the second color filter CF2 may be disposed on the first color filter CF1, and the third color filter CF3 may be disposed on the second color filter CF2.

Accordingly, the third pattern P3 may entirely cover the outer surface OS-1 of the first pattern P1. The fourth pattern P4 may cover all of the outer surface OS-2 and the inner surfaces IS-1 and IS-2 of the second pattern P2. The third color filter CF3 may cover all of the outer surface OS-3 and the inner surface IS-3 of the third pattern P3 and the outer surface OS-4 and the inner surface IS-4 of the fourth pattern P4.

However, embodiments of the disclosure are not limited thereto, and according to another embodiment, the first color filter CF1 may be disposed on the second color filter CF2, and the third color filter CF3 may be disposed on the first color filter CF1. At this time, the first pattern P1 may cover the outer surface OS-3 and the inner surface IS-3 of the third pattern P3, and the second pattern P2 may cover the outer surface OS-4 and the inner surface IS-4 of the fourth pattern P4.

In an embodiment, the peripheral region NPA may include the first region A1 and the second region A2. The first region A1 may be a region in which only the third color filter CF3 may be disposed, and the second region A2 may be a region in which two or more among the first to third color filters CF1, CF2, and CF3 may be laminated along a thickness direction. For convenience of description, in FIG. 6C, a portion of the third color filter CF3 overlapping the second region A2 is illustrated in bold. The boundary between the first region A1 and the second region A2 may be defined by the outer surface OS-3 of the third pattern P3 and the outer surface OS-4 of the fourth pattern P4 included in the second color filter CF2.

According to an embodiment, in a plan view, the second region A2 may be provided in the form of multiple patterns, and some groups of the second regions A2 may respectively surround the first pixel regions PA1, and other groups thereof may respectively surround the second and third pixel regions PA2 and PA3 adjacent to each other and included in one corresponding pixel group among pixel groups.

In a plan view, the first region A1 may surround the second regions A2. The first region A1 may be disposed on an outer side of the first to sixth openings OP1 to OP6. In an embodiment, the first region A1 may be disposed between the first and second pixel regions PA1 and PA2 adjacent to each other and between the first and third pixel regions PA1 and PA3 adjacent to each other in one pixel group, but may not be disposed between the second and third pixel regions PA2 and PA3 adjacent to each other. The first region A1 may be disposed between pixel groups adjacent to each other. Accordingly, the first region A1 may be disposed between the second and third pixel regions PA2 and PA3 included in different pixel groups from each other and spaced apart in the first direction DR1.

As illustrated in FIG. 7A to FIG. 7E, each of the first to third color filters CF1, CF2, and CF3 (see FIG. 5A) may be provided by a photolithography process. In an embodiment, the color filter layer CFL may be provided by sequentially forming the first color filter CF1 including the first and second patterns P1 and P2 described above with reference to FIG. 5A to FIG. 6C, the second color filter CF2 including the third and fourth patterns P3 and P4, and the third color filter CF3.

Figure 7A:
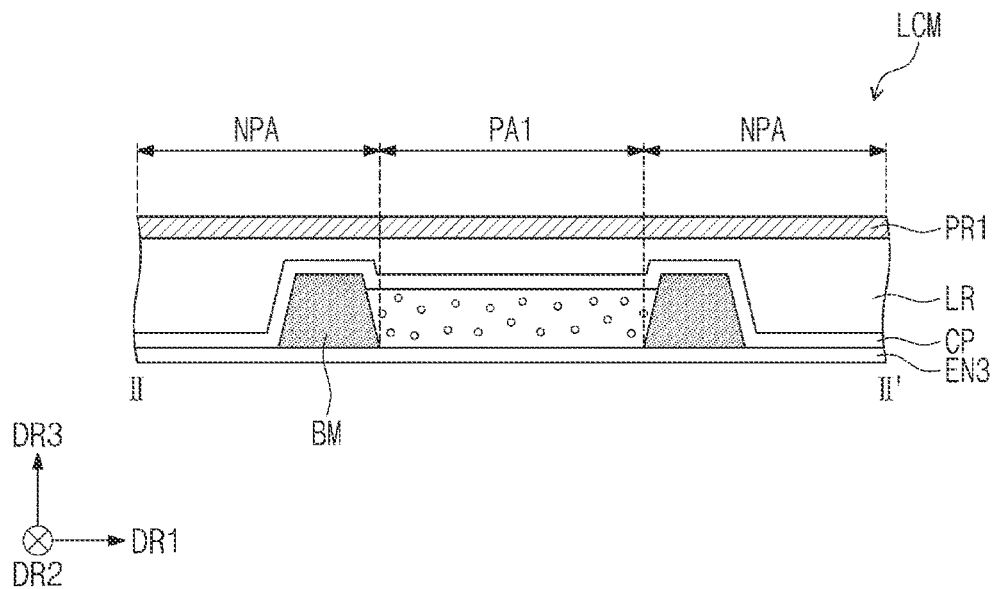
FIG. 7A to FIG. 7D are schematic cross-sectional views of a light control unit according to an embodiment of the disclosure taken along line II-IF of FIG. 6A to FIG. 6C.

As illustrated in FIG. 7A, in order to form the first color filter CF1, a photoresist (hereinafter, a first photoresist PR1) for the first color filter CF1 may be coated on the low refractive layer LR. The first photoresist PR1 may entirely coat an upper surface of the low refractive layer LR in the display region DA. In an embodiment, the first photoresist PR1 may be coated in a slit coating manner.

Figure 7B:
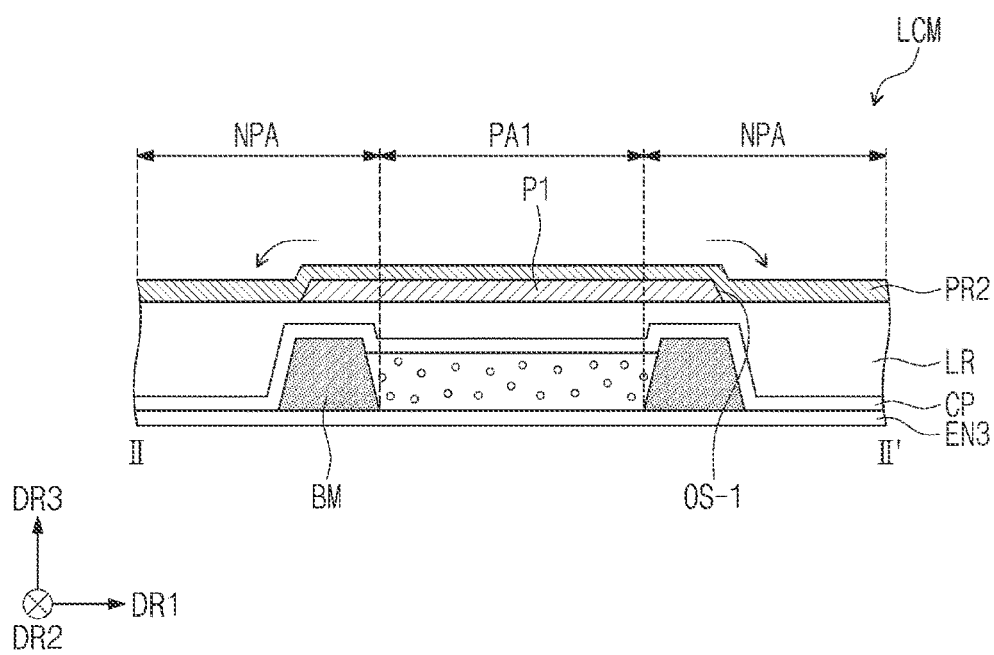
Figure 7C:
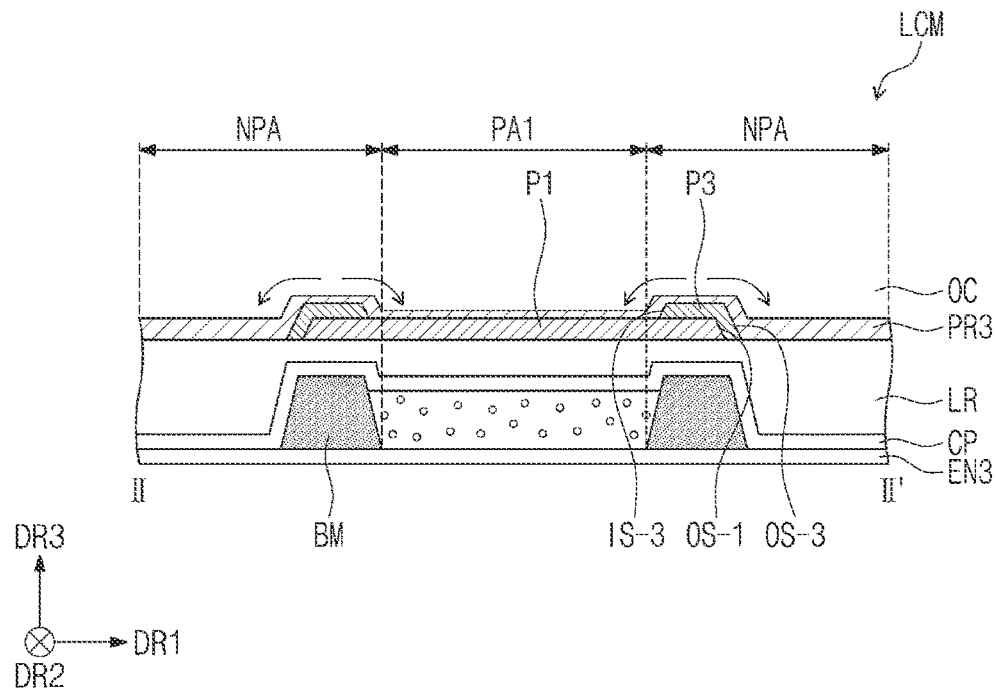
Figure 7D:
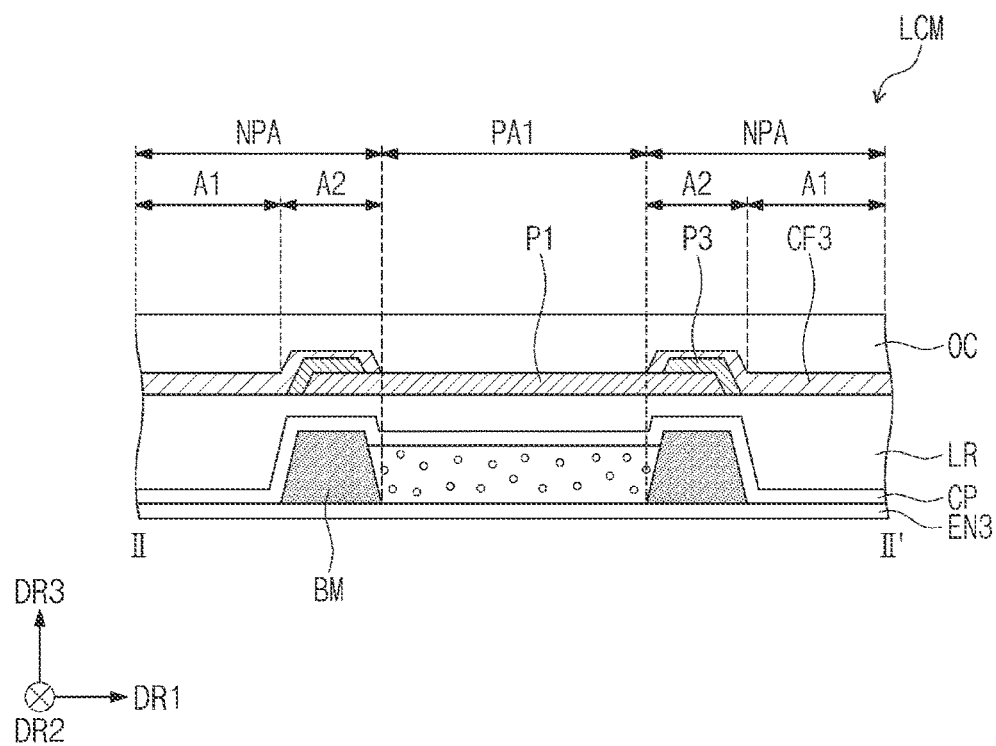
Figure 7E:
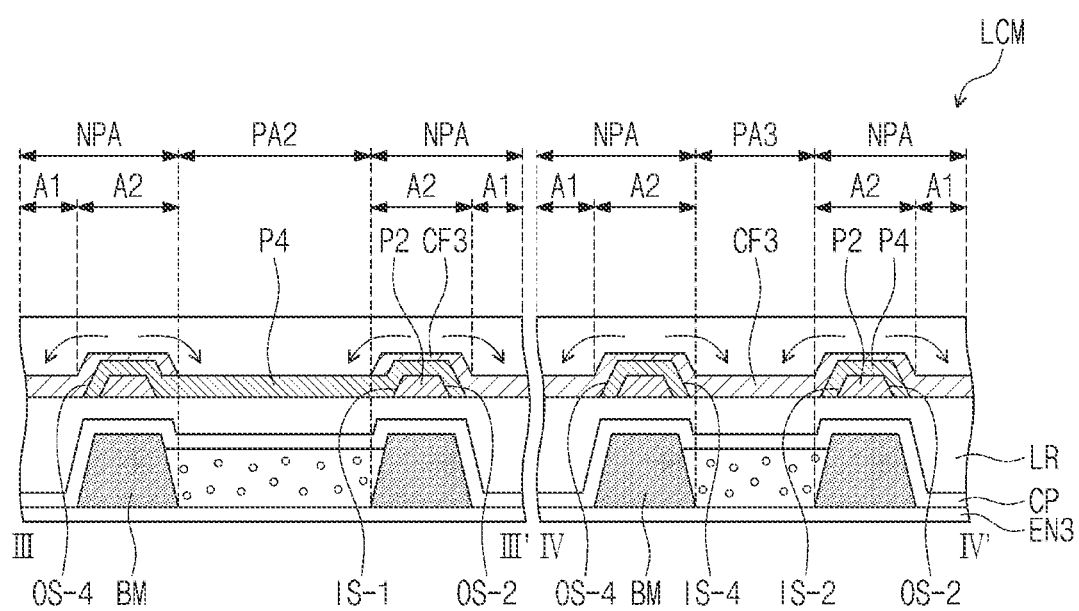
FIG. 7E is a schematic cross-sectional view of a light control unit according to an embodiment of the disclosure taken along line and IV-IV' of FIG. 6A to FIG. 6C.

Thereafter, as illustrated in FIG. 7B and FIG. 7E, in order to form the first color filter CF1 having the first and second patterns P1 and P2, the coated first photoresist PR1 of FIG. 7A may be patterned through an exposure process and an etching process.

According to the disclosure, by providing the first color filter CF1 having multiple patterns spaced apart from each other, it may be possible to provide the peripheral region NPA not overlapped by the first color filter CF1 on an outer side of the first and second openings OP1 and OP2 (refer to FIG. 6A).

Thereafter, in order to form the second color filter CF2, a photoresist (hereinafter, a second photoresist PR2) for the second color filter CF2 may be coated on the low refractive layer LR. The second photoresist PR2 may entirely coat the upper surface of the low refractive layer LR in the display region DA (see FIG. 2). In an embodiment, the second photoresist PR2 may be coated in a slit coating manner.

At this time, the second photoresist PR2 may cover the entire first color filter CF1. For example, the second photoresist PR2 may cover the outer surface OS-1 of each of the first patterns P1, and the outer surface OS-2 and the inner surfaces IS-1 and IS-2 of each of the second patterns P2, and in the second photoresist PR2, steps corresponding to the first patterns P1 and the second patterns P2 may be formed.

As an example, a portion of the second photoresist PR2 disposed on the first pattern P1 may flow down from an upper surface of the first pattern P1 along the outer surface OS-1 of the first pattern P1. As a result, the thickness of the second photoresist PR2 remaining on the first pattern P1 may be reduced.

Thereafter, as illustrated in FIG. 7C and FIG. 7E, in order to form the second color filter CF2 having the third and fourth patterns P3 and P4, the coated second photoresist PR2 of FIG. 7B may be patterned through an exposure process and an etching process. As a result, by providing the second color filter CF2 having multiple patterns spaced apart from each other, it may be possible to form the peripheral region NPA not overlapped by the second color filter CF2 on an outer side of the third and fourth openings OP3 and OP4 (refer to FIG. 6B).

Thereafter, in order to form the third color filter CF3, a photoresist (hereinafter, a third photoresist PR3) for the third color filter CF3 may be coated on the low refractive layer LR. The third photoresist PR3 may entirely coat the upper surface of the low refractive layer LR in the display region DA (see FIG. 2). In an embodiment, the third photoresist PR3 may be coated in a slit coating manner.

At this time, the third photoresist PR3 may cover all of the first and second color filters CF1 and CF2. For example, the third photoresist PR3 may cover the outer surface OS-3 and the inner surface IS-3 of each of the third patterns P3, and the outer surface OS-4 and the inner surface IS-4 of each of the fourth patterns P4, and in the third photoresist PR3, steps corresponding to the third patterns P3 and the fourth patterns P4 may be formed.

As an example, a portion of the third photoresist PR3 disposed on the third pattern P3 may define the outer surface OS-3 of the third pattern P3 and the third opening OP3 from an upper surface of the third pattern P3, and may flow down along the inner surface IS-3 of the third pattern P3. As a result, the thickness of the third photoresist PR3 remaining on the third pattern P3 may be reduced.

Thereafter, through an exposure process and an etching process, a portion of the third photoresist PR3 may be removed such that the third color filter CF having the fifth openings OP5 and the sixth openings OP6 defined thereon is formed.

Thereafter, as illustrated in FIG. 7D and FIG. 7E, the first to third color filters CF1, CF2, and CF3 may all be formed, and the peripheral region NPA may be divided into the first and second regions A1 and A2.

At this time, in the second region A2, the thicker the step formed by color filters laminated in multiple layers, the greater the amount of organic material required by the planarization layer OC to provide a flat upper surface, so that the thickness of the planarization layer OC may increase. Accordingly, the light emission efficiency for light passing through the planarization layer OC and finally provided a user may be somewhat reduced.

According to an embodiment, in order to prevent the reflection of external light, an optical film may be further attached on the planarization layer OC. As the thickness of the step increases, the degree of planarization of the planarization layer OC decreases, so that there may be a pore region between the planarization layer OC and the optical film attached thereto. At this time, the reflectance reduction function of the optical film is not exerted, so that the display quality of the display device DD (see FIG. 1) may decrease.

According to an embodiment, the thickness of the second color filter CF2 disposed on the first color filter CF1 and the thickness of the third color filter CF3 disposed on the second color filter CF2 may decrease, so that a step thickness of the color filter layer CFL overlapping the second region A2 may be reduced.

As a result, the planarization layer OC may provide an upper surface with an improved degree of planarization without using a large amount of organic material, so that the display device DD (see FIG. 1) with improved reliability may be provided. Light emission efficiency may be improved by including a thin planarization layer OC, and the defect rate of the optical film may be reduced by improving the degree of planarization, so that the display device DD (see FIG. 1) with improved display quality may be provided.

As illustrated in FIG. 7E, the second photoresist PR2 disposed on the second pattern P2 also spreads along the outer surface OS-2 of the second pattern P2, the inner surface IS-1 of the second pattern P2 defining the first opening OP1, and the inner surface IS-2 of the second pattern P2 defining the second opening OP2, so that the thickness of the fourth pattern P4 disposed on the second pattern P2 may be reduced.

The third photoresist PR3 disposed on the fourth pattern P4 also spreads along a stepped surface of the fourth pattern P4 formed corresponding to the outer surface OS-4 of the fourth pattern P4, the inner surface IS-4 of the fourth pattern P4 defining the fourth opening OP4, and the inner surface IS-2 of the second pattern P2 defining the second opening OP2, so that the thickness of the third color filter CF3 disposed on the fourth pattern P4 may be reduced.

Therefore, the step thickness of the color filter layer CFL overlapping the second region A2 may be reduced, so that the display device DD (see FIG. 1) with improved reliability and improved display quality may be provided.

Figure 8A:
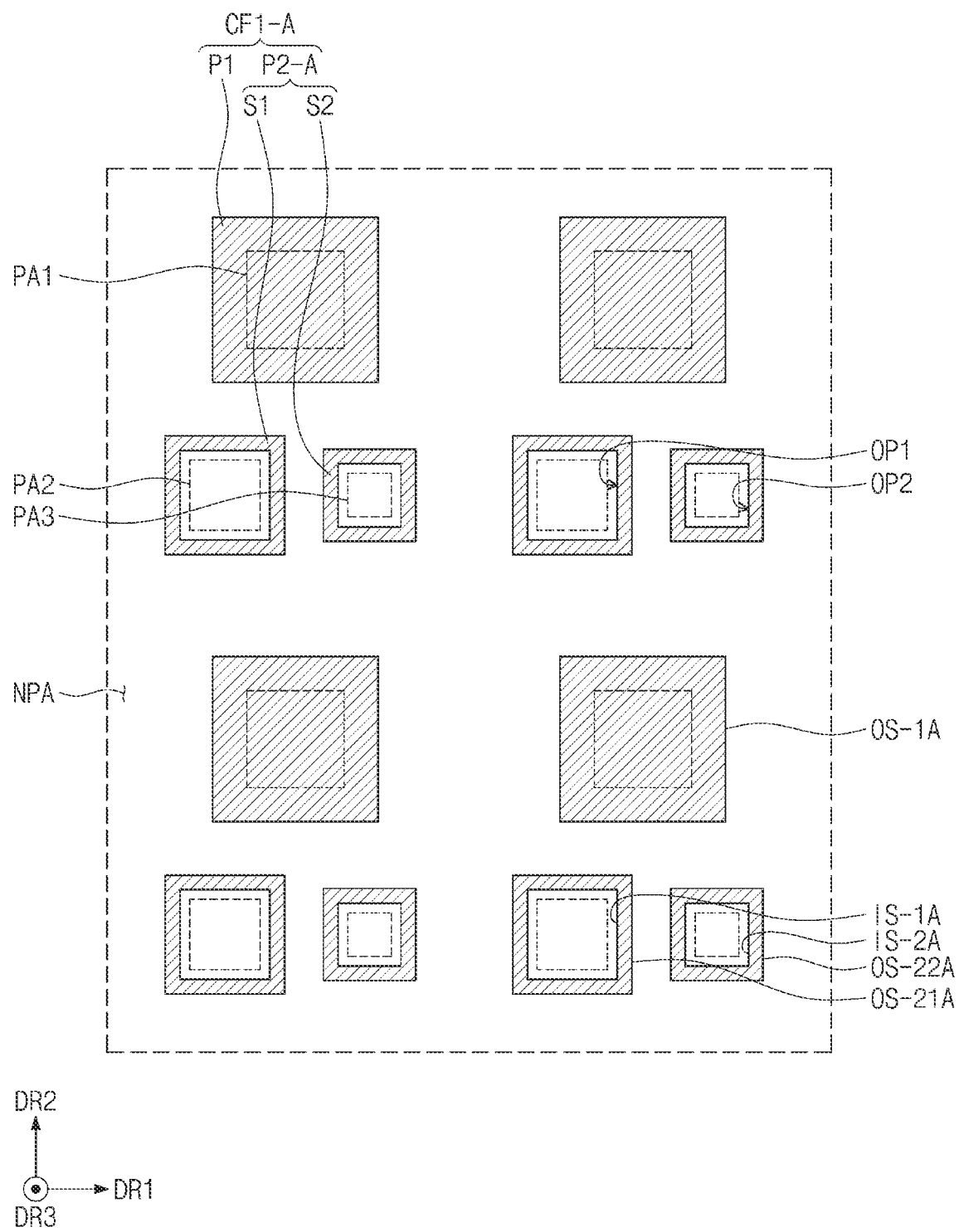
FIG. 8A and FIG. 8B are enlarged schematic plan views of some components of a color filter layer according to an embodiment of the disclosure.
Figure 8B:
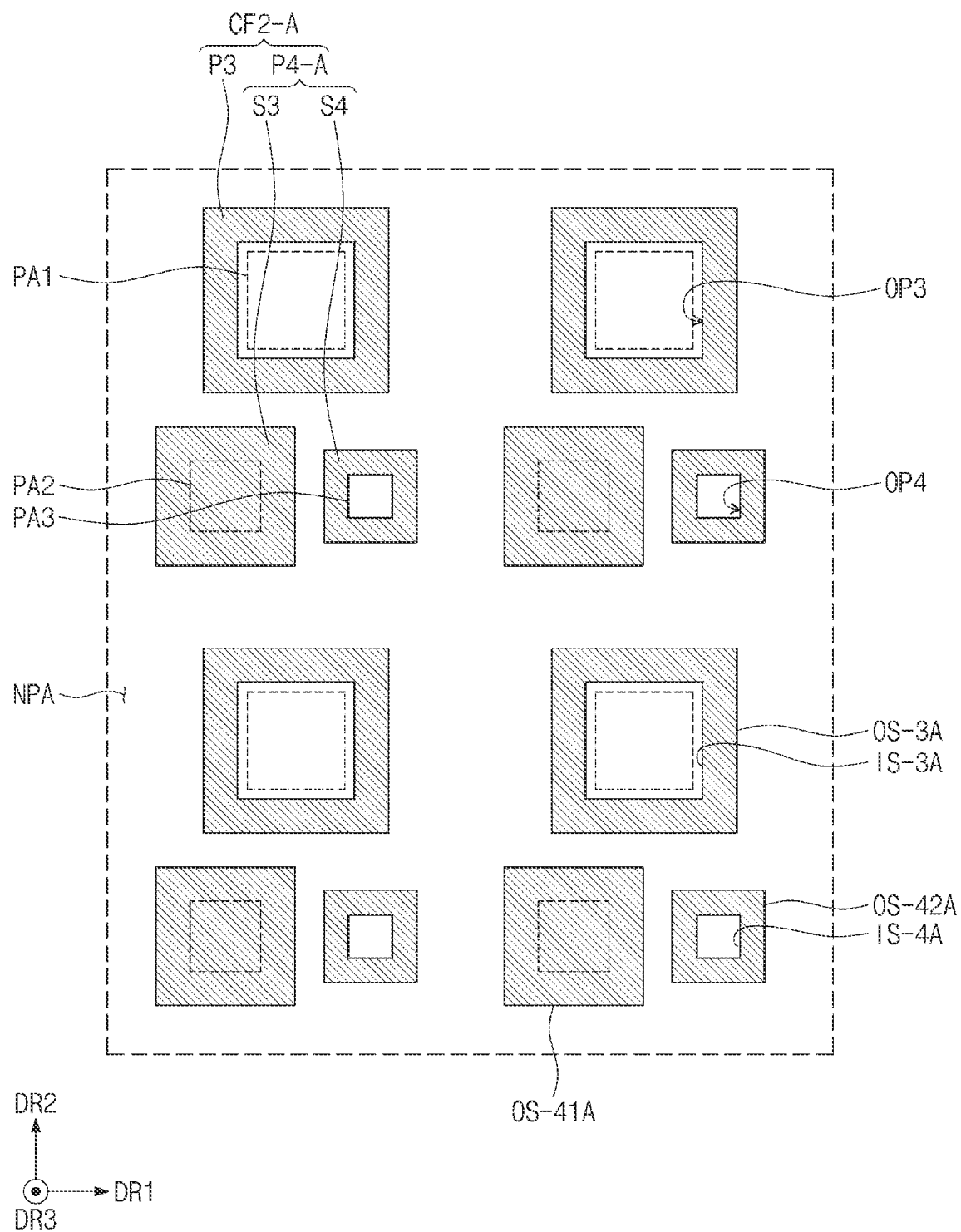

FIG. 8A and FIG. 8B are enlarged schematic plan views of some components of a color filter layer according to an embodiment of the disclosure. FIG. 8A illustrates an enlarged plan view of a first color filter CF1-A, and FIG. 8B illustrates an enlarged plan view of a second color filter CF2-A. The description given above with reference to FIG. 6C may be similarly applied to a third color filter CF3, and thus, a detailed description thereof will be omitted.

Referring to FIG. 8A, the first color filter CF1-A may include first patterns P1 and second patterns P2-A. Each of the first patterns P1 may include an outer surface OS-1A. The same description given with reference to FIG. 6A may be equally applied to the first patterns P1.

In an embodiment, each of the second patterns P2-A may include a first sub-pattern S1 and a second sub-pattern S2.

The first sub-pattern S1 may overlap a portion of the peripheral region NPA adjacent to the second pixel region PA2. The sub-pattern S1 may have a first opening OP1 overlapping a corresponding second pixel region PA2. The first sub-pattern S1 may be spaced apart from the first pattern P1 in a diagonal direction of the first direction DR1.

The second sub-pattern S2 may overlap a portion of the peripheral region NPA adjacent to the second pixel region PA3. The second sub-pattern S2 may have a second opening OP2 overlapping a corresponding third pixel region PA3. The second sub-pattern S2 may be spaced apart from the first pattern P1 in a direction crossing the diagonal direction.

The second sub-pattern S2 may be spaced apart from the first sub-pattern S1. The first and second sub-patterns S1 and S2 of each of the second patterns P2 may be spaced apart from each other in the first direction DR1. However, embodiments of the disclosure are not limited thereto, and the arrangement form of the first and second sub-patterns S1 and S2 may be variously modified according to the arrangement form of the first to third pixel regions PA1, PA2, and PA3.

The first and second sub-patterns S1 and S2 may each have a quadrangular band shape in a plan view. For example, the first and second sub-patterns S1 and S2 may each include outer surfaces OS-21A and OS-22A and inner surfaces IS-1A and IS-2A including sides extended in the first direction DR1 and sides extended in the second direction DR2. However, embodiments of the disclosure are not limited thereto, and the shape of the first and second sub-patterns S1 and S2 may vary according to the shape of the second and third pixel regions PA2 and PA3.

Referring to FIG. 8B, the second color filter CF2-A may include third patterns P3 and fourth patterns P4-A. The third patterns P3 may each include an outer surface OS-3A and an inner surface IS-3A defining a third opening OP3. The same description given with reference to FIG. 6B may be equally applied to the third patterns P3.

In an embodiment, each of the fourth patterns P4-A may include a third sub-pattern S3 and a fourth sub-pattern S4.

The third sub-pattern S3 may overlap the second pixel region PA2 and a portion of the peripheral region NPA adjacent thereto. The area of the third sub-pattern S3 may be greater than the area of a corresponding second pixel region PA2 in a plan view. The third sub-pattern S3 may be spaced apart from the first pattern P3 in a diagonal direction of the first direction DR1.

The fourth sub-pattern S4 may overlap a portion of the peripheral region NPA adjacent to the third pixel region PA3. The fourth sub-pattern S4 may have a fourth opening OP4 overlapping a corresponding third pixel region PA3. The area of the fourth opening OP4 may be the same as the area of the corresponding third pixel region PA3 in a plan view. However, embodiments of the disclosure are not limited thereto, and the area of the fourth opening OP4 may be greater than the area of the third pixel region PA3. The fourth sub-pattern S4 may be spaced apart from the third pattern P3 in a direction crossing the diagonal direction.

The fourth sub-pattern S4 may be spaced apart from the third sub-pattern S3. The third and fourth sub-patterns S3 and S4 of each of the fourth patterns P4 may be spaced apart from each other in the first direction DR1. However, embodiments of the disclosure are not limited thereto, and the arrangement form of the third and fourth sub-patterns S3 and S4 may be variously modified according to the arrangement form of the first to third pixel regions PA1, PA2, and PA3.

The third sub-patterns S3 may each have a quadrangular shape in a plan view. For example, an outer surface OS-41A of the third sub-pattern S3 may include sides extended in the first direction DR1 and sides extended in the second direction DR2.

The fourth sub-patterns S4 may each have a quadrangular band shape in a plan view. For example, an outer surface OS-42A and an inner surface IS-4A of each of the fourth sub-patterns S4 may include sides extended in the first direction DR1 and sides extended in the second direction DR2. However, embodiments of the disclosure are not limited thereto, and the shape of the third and fourth sub-patterns S3 and S4 may vary according to the shape of the second and third pixel regions PA2 and PA3.

The third sub-pattern S3 may cover the outer surface OS-21A and the inner surface IS-1A of the first sub-pattern S1 illustrated in FIG. 8A. The fourth sub-pattern S4 may cover the outer surface OS-22A and the inner surface IS-2A of the second sub-pattern S2 illustrated in FIG. 8A.

According to an embodiment, in the process of coating the second photoresist PR2 (see FIG. 7B) to form the third and fourth sub-patterns S3 and S4, the second photoresist PR2 (see FIG. 7B) disposed on the first and second sub-patterns S1 and S2 may flow down by the outer surface OS-21A and the inner surface IS-1A of the first sub-pattern S1, and the outer surface OS-22A and the inner surface IS-2A of the second sub-pattern S2. Accordingly, the thickness of the third and fourth sub-patterns S3 and S4 respectively formed on the first and second sub-patterns S1 and S2 may be reduced.

In the process of coating the third photoresist PR3 (see FIG. 7C) to form the third color filter CF3 (see FIG. 6C), the third photoresist PR3 (see FIG. 7C) disposed on the third and fourth sub-patterns S3 and S4 may flow down by the outer surface OS-41A of the third sub-pattern S3, and the outer surface OS-42A and the inner surface IS-4A of the fourth sub-pattern S4. Accordingly, the thickness of the third color filter CF3 (see FIG. 6C) formed on the third and fourth sub-patterns S3 and S4 may be reduced. As a result, the step thickness of the color filter layer CFL (see FIG. 5A) overlapping the second region A2 may be reduced to improve the degree of planarization, so that the display device DD (see FIG. 1) with improved reliability and improved display quality may be provided.

In an embodiment, the first region A1 (see FIG. 5A) may be disposed between the first and second pixel regions PA1 and PA2 adjacent to each other and between the first and third pixel regions PA1 and PA3 adjacent to each other in one pixel group as well as between the second and third pixel regions PA2 and PA3 adjacent to each other. For example, by providing an empty space, in which the second and third photoresists PR2 and PR3 (see FIG. 7B and FIG. 7C) may spread, even between the second and third pixel regions PA2 and PA3 adjacent to each other, it may be possible to further reduce the thickness of a step.

Figure 9A:
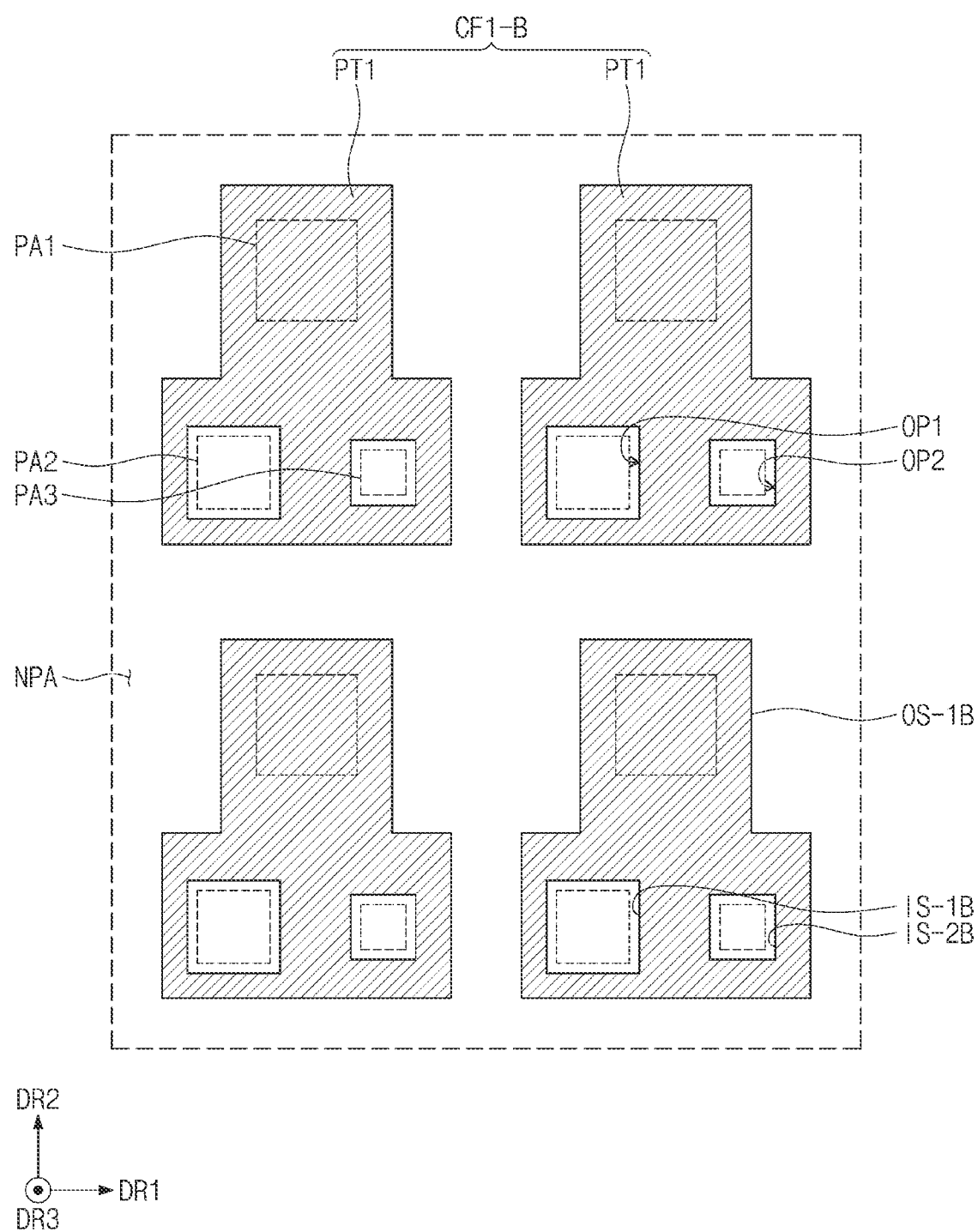
FIG. 9A and FIG. 9B are enlarged schematic plan views of some components of a color filter layer according to an embodiment of the disclosure.
Figure 9B:
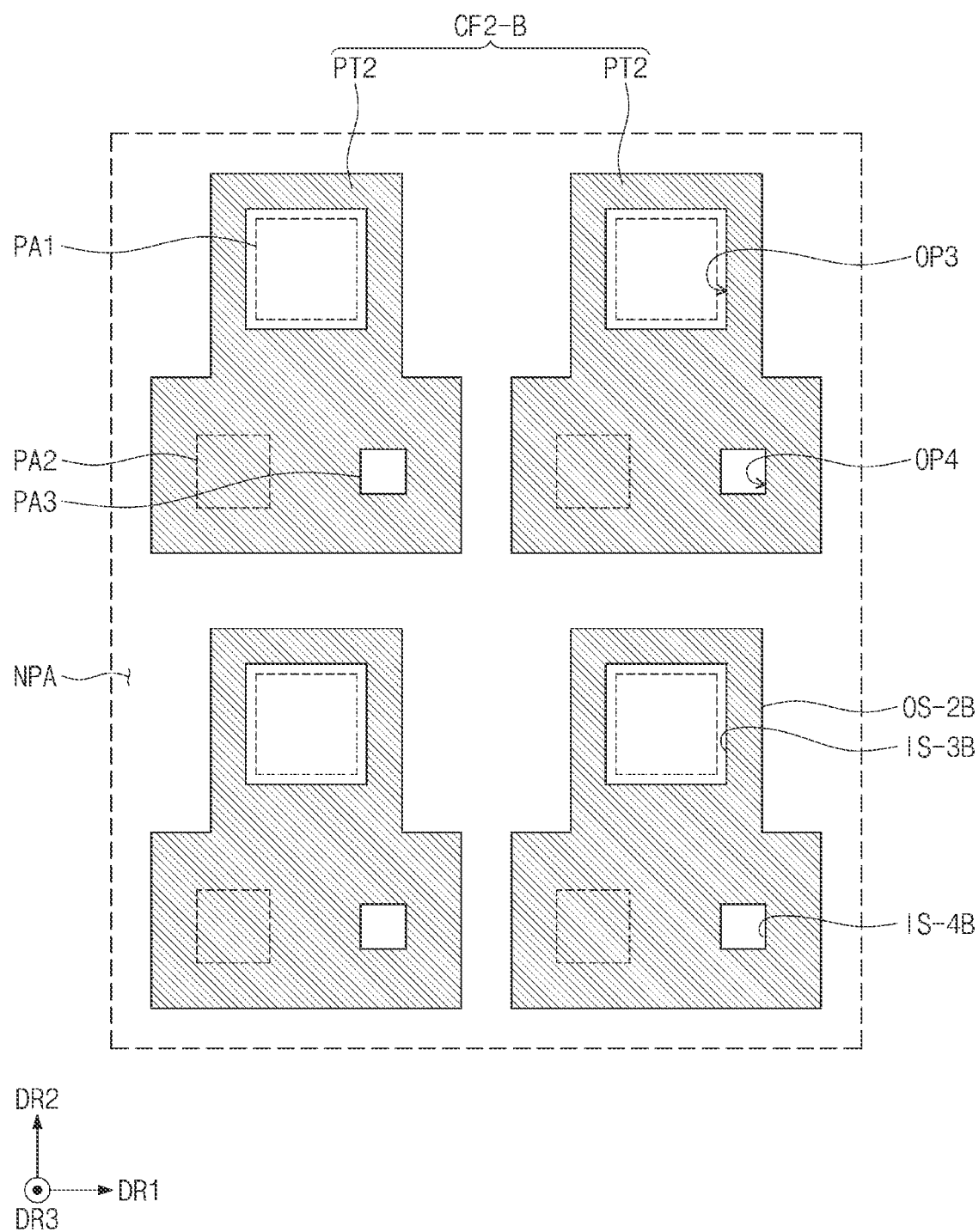

FIG. 9A and FIG. 9B are enlarged schematic plan views of some components of a color filter layer according to an embodiment of the disclosure. FIG. 9A illustrates an enlarged plan view of a first color filter CF1-B, and FIG. 9B illustrates an enlarged plan view of a second color filter CF2-B. The description given above with reference to FIG. 6C may similarly be applied to a third color filter CF3, and thus, a detailed description thereof will be omitted.

Referring to FIG. 9A, the first color filter CF1-B may include multiple first color patterns PT1.

Each of the first color patterns PT1 may overlap a corresponding first pixel region PA1 and a portion of the peripheral region NPA. The first color patterns PT1 may each have a first opening OP1 overlapping a corresponding second pixel region PA2 and a second opening OP2 overlapping a corresponding third pixel region PA3.

The first color patterns PT1 may be arranged in the first and second directions DR1 and DR2 while being spaced apart from each other. Each of the first color patterns PT1 may not be disposed on an outer side of the first and second openings OP1 and OP2 of the peripheral region NPA.

The first color patterns PT1 may each include an outer surface OS-1B, an inner surface IS-1B defining the first opening OP1, and an inner surface IS-2B defining the second opening OP2.

FIG. 9A illustrates the shape of the first color patterns PT1. The shape of the first color patterns PT1 is not limited to any one embodiment as long as the first color patterns PT1 adjacent to each other may be spaced apart and provide the outer surface OS-1B along which the second photoresist PR2 (see FIG. 7B) may flow down.

Referring to FIG. 9B, the second color filter CF2-B may include multiple second color patterns PT2.

Each of the second color patterns PT2 may overlap a corresponding second pixel region PA2 and a portion of the peripheral region NPA. The second color patterns PT2 may each have a third opening OP3 overlapping a corresponding first pixel region PA1 and a fourth opening OP4 overlapping a corresponding third pixel region PA3.

The second color patterns PT2 may be arranged in the first and second directions DR1 and DR2 while being spaced apart from each other. Each of the second color patterns PT2 may not be disposed on an outer side of the third and fourth openings OP3 and OP4 of the peripheral region NPA.

The second color patterns PT2 may each include an outer surface OS-2B, an inner surface IS-3B defining the third opening OP3, and an inner surface IS-4B defining the fourth opening OP4.

FIG. 9B illustrates the shape of the second color patterns PT2. The shape of the second color patterns PT2 is not limited to any one embodiment as long as the second color patterns PT2 adjacent to each other may be spaced apart and provide the outer surface OS-2B along which the third photoresist PR3 (see FIG. 7C) can flow down.

The second color patterns PT2 may cover all of the outer surface OS-1B and the inner surfaces IS-1B and IS-2B of a corresponding first color pattern PT1. The third color filter CF3 (see FIG. 6C) may cover all of the outer surface OS-2B and the inner surfaces IS-3B and IS-4B of each of the second color patterns PT2.

In an embodiment, the outer surface OS-1B of each of the first color patterns PT1 may provide a path through which the second photoresist PR2 (see FIG. 7B) can flow down to reduce the thickness of the second color pattern PT2 disposed on the first color pattern PT1. The outer surface OS-2B of each of the second color patterns PT2 may provide a path through which the third photoresist PR3 (see FIG. 7C) may flow down to reduce the thickness of the third color pattern CF (see FIG. 7D) disposed on the second color pattern PT2. As a result, the degree of planarization may be improved, so that the display device DD (see FIG. 1) with improved reliability and improved display quality may be provided.

In an embodiment, the second region A2 (see FIG. 5A) may be provided in the form of multiple patterns in a plan view, and the second region A2 may respectively surround pixel groups. For example, one second region A2 may surround all of one first and third pixel regions PA1, PA2, and PA3 constituting one pixel group.

Accordingly, the first region A1 (see FIG. 5A) may not be disposed between the first and second pixel regions PA1 and PA2 adjacent to each other, between the first and third pixel regions PA1 and PA3 adjacent to each other, and between the second and third pixel regions PA2 and PA3 adjacent to each other in one pixel group. The first region A1 (see FIG. 5A) may be disposed between pixel groups adjacent to each other.

Figure 10A:
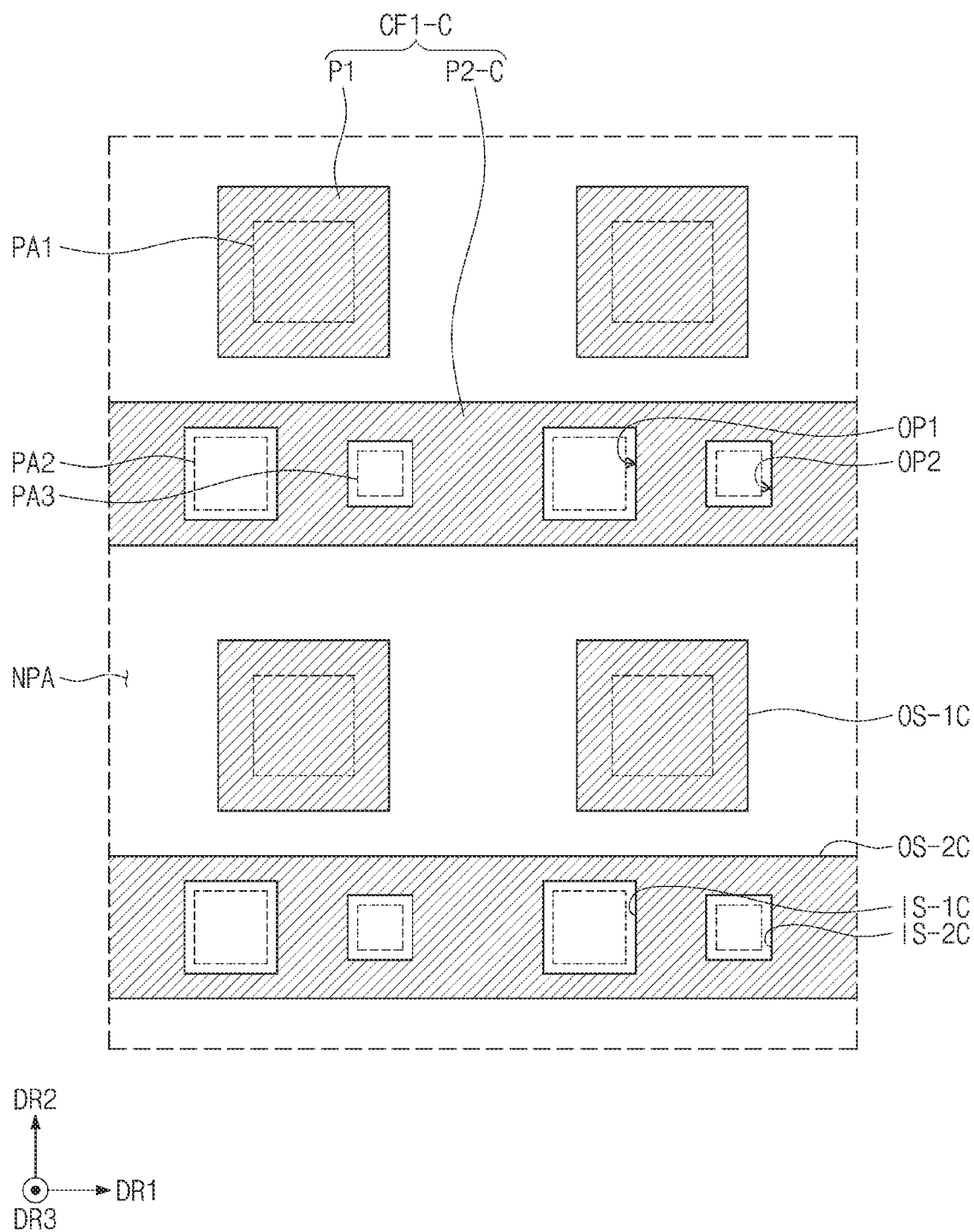
FIG. 10A and FIG. 10B are enlarged schematic plan views of some components of a color filter layer according to an embodiment of the disclosure.
Figure 10B:
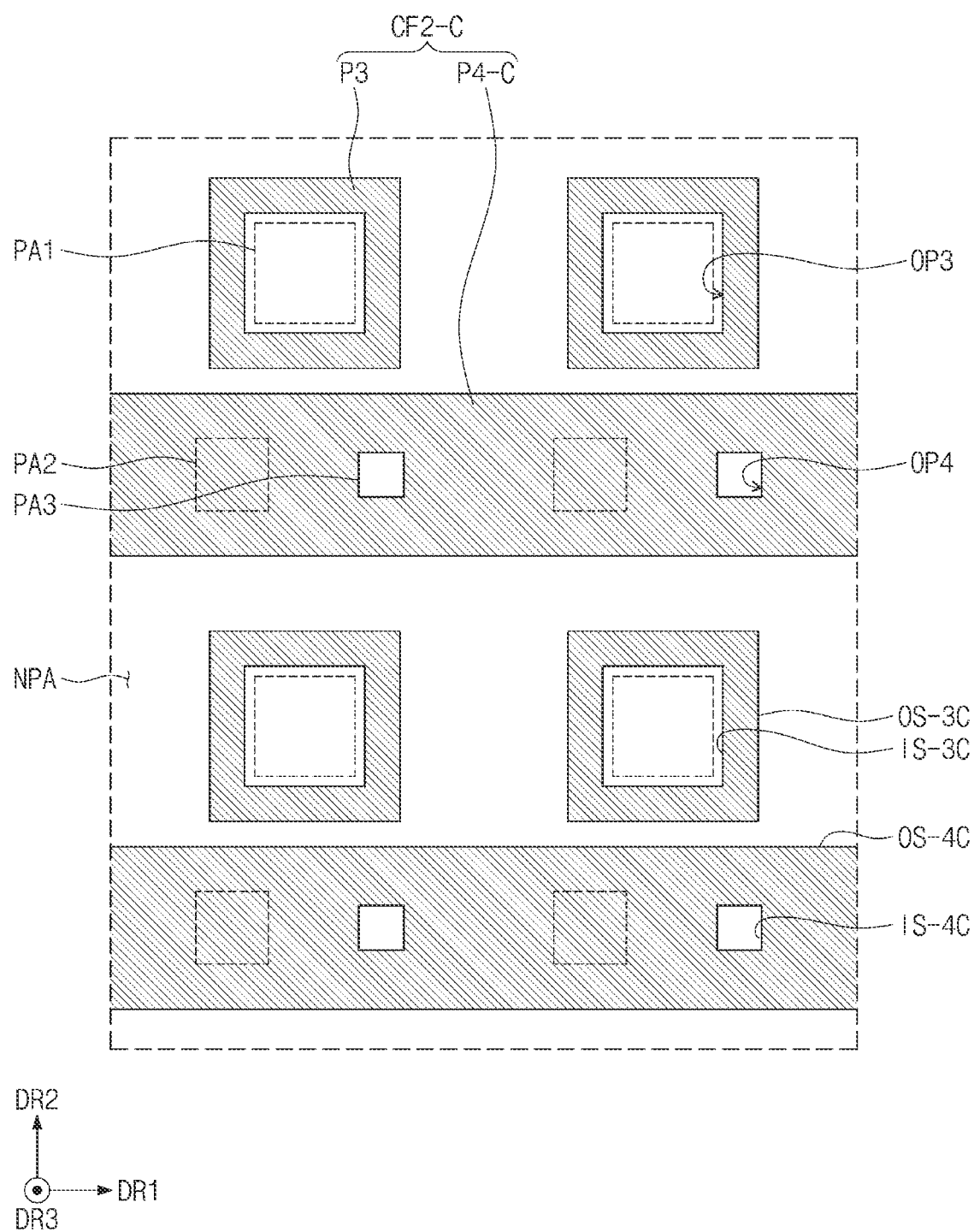

FIG. 10A and FIG. 10B are enlarged schematic plan views of some components of a color filter layer according to an embodiment of the disclosure. FIG. 10A illustrates an enlarged plan view of a first color filter CF1-C, and FIG. 10B illustrates an enlarged plan view of a second color filter CF2-C. The description given above with reference to FIG. 6C may similarly be applied to a third color filter CF3, and thus, a detailed description thereof will be omitted.

Referring to FIG. 10A, the first color filter CF1-C may include first patterns P1 and second patterns P2-C. Each of the first patterns P1 may include an outer surface OS-1C. The same description given with reference to FIG. 6A may be equally applied to the first patterns P1.

In an embodiment, the second patterns P2-C may each be extended in the first direction DR1. Each of the second patterns P2-C opposes each other in the second direction DR2, and each thereof may include outer surfaces OS-2C extended in the first direction DR1. The second patterns P2-C may be arranged while being spaced apart in the second direction DR2.

The second patterns P2-C may each include multiple first openings OP1 and multiple second openings OP2. Each of the first openings OP1 may overlap a corresponding second pixel region PA2, and each of the second openings OP2 may overlap a corresponding third pixel region PA3. The first and second openings OP1 and OP2 of each of the second patterns P2-C may be alternately arranged in the first direction DR1.

The second patterns P2-C may each include multiple inner surfaces IS-1C defining the first openings OP1 and multiple inner surfaces IS-2C defining the second openings OP2.

The first patterns P1 and one second pattern P2-C arranged in the first direction DR1 to form one row may be alternately arranged with each other in the second direction DR2.

Referring to FIG. 10B, the second color filter CF2-C may include third patterns P3 and fourth patterns P4-C. The third patterns P3 may each include an outer surface OS-3C and an inner surface IS-3C defining a third opening OP3. The same description given with reference to FIG. 6B may be equally applied to the third patterns P3.

In an embodiment, the fourth patterns P4-C may each be extended in the first direction DR1. Each of the fourth patterns P4-C opposes each other in the second direction DR2, and each thereof may include outer surfaces OS-4C extended in the first direction DR1. The fourth patterns P4-C may be arranged while being spaced apart in the second direction DR2.

In each of the fourth patterns P4-C, multiple fourth openings OP4 may be defined. Each of the fourth openings OP4 may overlap a corresponding third pixel region PA3. The fourth openings OP4 defined in each of the fourth patterns P4-C may be arranged in the first direction DR1.

The fourth patterns P4-C may each include multiple inner surfaces IS-4C defining the fourth openings OP4.

The third patterns P3 and one fourth pattern P4-C arranged in the first direction DR1 to form one row may be alternately arranged with each other in the second direction DR2.

In an embodiment, the third patterns P3 may respectively cover the outer surfaces OS-1C of the first patterns P1 illustrated in FIG. 10A. The fourth patterns P4-C may cover the outer surfaces OS-2C and the inner surfaces IS-1C of the second patterns P2-C illustrated in FIG. 10A and the inner surfaces IS-2C respectively defining the second openings OP2.

The outer surfaces OS-1C of the first patterns P1 and the outer surfaces OS-2C of the second patterns P2-C provide a path through which the second photoresist PR2 (see FIG. 7B) can flow down, and the outer surfaces OS-3C of the third patterns P3 and the outer surfaces OS-4C of the fourth patterns P4-C provide a path through which the third photoresist PR3 (see FIG. 7C) can flow down, so that the degree of planarization may be improved. As a result, the display device DD (see FIG. 1) with improved reliability and improved display quality may be provided.

In an embodiment, the boundary between the first region A1 (see FIG. 5A) and the second region A2 (see FIG. 5A) may be defined by the outer surface OS-2C of each of the second patterns P2-C.

In an embodiment, the second region A2 (see FIG. 5A) may be provided in the form of multiple patterns in a plan view, and some groups of the second regions A2 may respectively surround the first pixel regions PA1, and the other groups thereof may surround all of the second and third pixel regions PA2 and PA3 arranged alternately to each other in the first direction DR1.

Accordingly, the first region A1 (see FIG. 5A) may be disposed between the first and second pixel regions PA1 and PA2 adjacent to each other and between the first and third pixel regions PA1 and PA3 adjacent to each other in one pixel group, but may not be disposed between the second and third pixel regions PA2 and PA3 adjacent to each other.

The first region A1 (see FIG. 5A) may be disposed between pixel groups adjacent to each other and spaced apart in the second direction DR2, between the first pixel regions PA1 adjacent to each other and spaced apart in the first direction DR1, but may not be disposed between the second and third pixel regions PA2 and PA3 included in different pixel groups from each other and spaced apart in the first direction DR1.

Figure 11A:
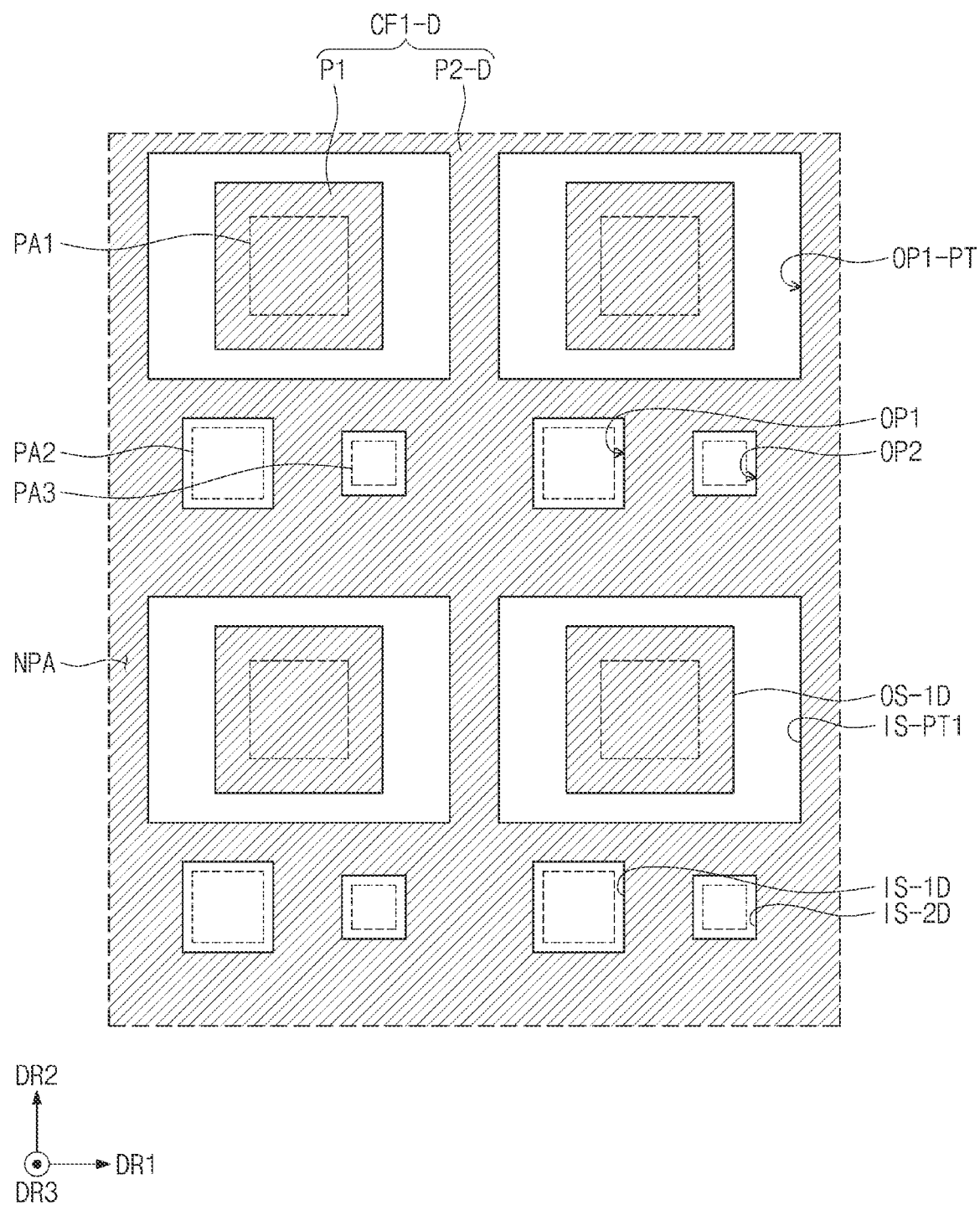
FIG. 11A and FIG. 11B are enlarged schematic plan views of some components of a color filter layer according to an embodiment of the disclosure.
Figure 11B:
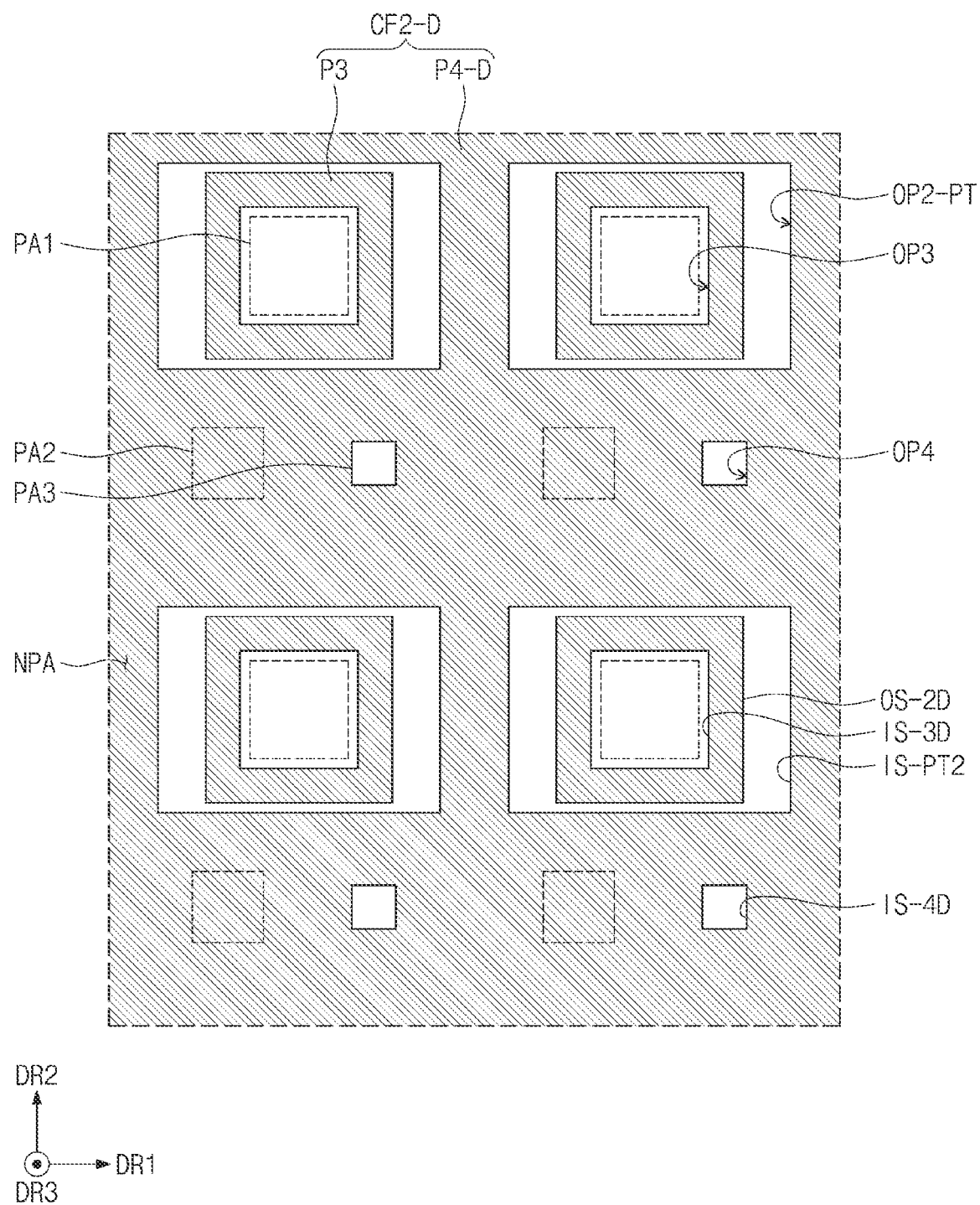

FIG. 11A and FIG. 11B are enlarged schematic plan views of some components of a color filter layer according to an embodiment of the disclosure. FIG. 11A illustrates an enlarged plan view of a first color filter CF1-D, and FIG. 11B illustrates an enlarged plan view of a second color filter CF2-D. The description given above with reference to FIG. 6C may similarly be applied to a third color filter CF3, and thus, a detailed description thereof will be omitted.

Referring to FIG. 11A, the first color filter CF1-D may include first patterns P1 and second patterns P2-D. The same description given with reference to FIG. 6A may be equally applied to the first patterns P1.

In an embodiment, the second pattern P2-D may overlap the peripheral region NPA. In the second pattern P2-D, multiple first openings OP1, multiple second openings OP2, and multiple first pattern openings OP1-PT may be defined. The second pattern P2-D may overlap all of the other regions except for a region of the peripheral region NPA overlapping the first openings OP1, the second openings OP2, and the first pattern openings OP1-PT.

Each of the first openings OP1 may overlap a corresponding second pixel region PA2. Each of the second openings OP2 may overlap a corresponding third pixel region PA3.

Each of the first pattern openings OP1-PT may overlap a corresponding first pixel region PAL Each of the first patterns P1 may be disposed in a corresponding first pattern opening OP1-PT. At this time, an outer surface OS-1D of each of the first patterns P1 may be spaced apart from an inner surface IS-PT1 of the second pattern P2-D defining a corresponding first pattern opening OP1-PT.

In a plan view, each of the first pattern openings OP1-PT may have a quadrangular shape. However, embodiments of the disclosure are not limited thereto, and the shape of the first pattern openings OP1-PT may be variously modified corresponding to the shape of the first pixel region PA1 or the shape of the first pattern P1, and may be different from the shape of the first pattern P1.

Referring to FIG. 11B, the second color filter CF2-D may include third patterns P3 and fourth patterns P4-D. The same description given with reference to FIG. 6B may be equally applied to the third patterns P3, and thus, a detailed description thereof will be omitted.

In an embodiment, the fourth pattern P4-D may overlap the peripheral region NPA. The fourth pattern P4-D, multiple fourth openings OP4 and multiple second pattern openings OP2-PT may be defined. The fourth pattern P4-D may overlap all of the other regions except for a region of the peripheral region NPA overlapping the fourth openings OP4 and the second pattern openings OP2-PT.

Each of the fourth openings OP4 may overlap a corresponding third pixel region PA3.

Each of the second pattern openings OP2-PT may overlap a corresponding first pixel region PA1. Each of the third patterns P3 may be disposed in a corresponding second pattern opening OP2-PT. At this time, an outer surface OS-3 of each of the third patterns P3 may be spaced apart from an inner surface IS-PT2 of the second pattern P2-D defining a corresponding second pattern opening OP2-PT.

In a plan view, each of the second pattern openings OP2-PT may have a quadrangular shape. However, embodiments of the disclosure are not limited thereto, and the shape of the second pattern openings OP2-PT may be variously modified corresponding to the shape of the first pixel region PA1 or the shape of the third pattern P3, and may be different from the shape of the first pixel region PA1 and the shape of the third pattern P3.

In an embodiment, each of the third patterns P3 may cover the outer surface OS-1D of a corresponding first pattern P1 among the first patterns P1 illustrated in FIG. 11A. The fourth pattern P4-D may cover an inner surface IS-1D of the second pattern P2 defining the first opening OP1 and an inner surface IS-2D of the second pattern P2-D defining the second opening OP2 illustrated in FIG. 11A.

The outer surface OS-1D of each of the first patterns P1 and the inner surface IS-PT1 of each of the second patterns P2-D defining a first pattern opening OP-PT1 provide a path through which the second photoresist PR2 (see FIG. 7B) can flow down, and an outer surface OS-2D of each of the third patterns P3 and the inner surface IS-PT2 of each of the fourth patterns P4-D defining a second pattern opening OP-PT2 provide a path through which the third photoresist PR3 (see FIG. 7C) can flow down, so that the degree of planarization may be improved. As a result, the display device DD (see FIG. 1) with improved reliability and improved display quality may be provided.

In an embodiment, the first region A1 (see FIG. 5A) may be provided in the form of multiple patterns in a plan view, and the first regions A1 (see FIG. 5A) may respectively surround a corresponding first pixel region PA1. Each of the first regions A1 (see FIG. 5A) may be disposed between the first and second pixel regions PA1 and PA2 adjacent to each other and between the first and third pixel regions PA1 and PA3 adjacent to each other in one pixel group, but may not be disposed between the second and third pixel regions PA2 and PA3 adjacent to each other.

According to the disclosure, in a region of a display region in which light may not be emitted to the outside, only one color filter overlaps and other color filters may not overlap, so that the thickness of a step of color filter layers formed by laminating multiple color filters may be reduced. Accordingly, it may be possible to improve the degree of planarization of a display device, thereby providing a display device with improved reliability, and improved display quality.

Although the disclosure has been described with reference to certain embodiments, it will be understood by those skilled in the art that various modifications and changes in form and details may be made therein without departing from the spirit and scope of the disclosure. Accordingly, the technical scope of the disclosure is not intended to be limited to the contents set forth in the detailed description of the specification, but rather should include all such modifications and changes.

What is claimed is:
1. A display device comprising:
a base layer including first to third pixel regions and a peripheral region surrounding the first to third pixel regions;
light emission elements that provide a source light to the first to third pixel regions, and that are disposed on the base layer; and
a color filter layer disposed on the light emission elements, wherein:
the color filter layer includes:
a first color filter overlapping the first pixel region and the peripheral region, and including first and second openings respectively overlapping the second and third pixel regions;
a second color filter overlapping the second pixel region and the peripheral region, and including third and fourth openings respectively overlapping the first and third pixel regions; and
a third color filter overlapping the third pixel region and the peripheral region, and including fifth and sixth openings respectively overlapping the first and second pixel regions, and
the peripheral region includes:
a single-layered region not overlapped by the first and second color filters and overlapped by the third color filter; and
a multi-layered region overlapped by at least two of the first to third color filters, wherein the single-layered region is disposed on an outer side of each of the first to fourth openings in a plan view.

2. The display device of claim 1, wherein:
the first color filter comprises:
a first pattern overlapping the first pixel region; and
a second pattern including the first and second openings, and that is spaced apart from the first pattern, and
the second color filter comprises:
a third pattern including the third opening; and
a fourth pattern overlapping the second pixel region, including the fourth opening, and that is spaced apart from the third pattern.

3. The display device of claim 2, wherein:
the third pattern covers an outer surface of the first pattern; and
the fourth pattern covers an outer surface of the second pattern and an inner surface of the second pattern defining the second opening.

4. The display device of claim 2, wherein:
the first pattern covers an outer surface of the third pattern; and
the second pattern covers an outer surface of the fourth pattern and an inner surface of the fourth pattern including the fourth opening.

5. The display device of claim 2, wherein:
the second pattern includes a first pattern opening surrounding the first pattern;
the fourth pattern includes a second pattern opening surrounding the third pattern; and
an inner surface of the second pattern defining the first pattern opening and an inner surface of the fourth pattern defining the second pattern opening are separated from the first and third patterns.

6. The display device of claim 2, wherein:
the second pattern comprises:
a first sub-pattern including the first opening; and
a second sub-pattern including the second opening, and spaced apart from the first sub-pattern, and the fourth pattern comprises:
a third sub-pattern overlapping the second pixel region; and
a fourth sub-pattern including the fourth opening, and that is spaced apart from the third sub-pattern.

7. The display device of claim 1, wherein:
the second pixel region and the third pixel region are arranged in a direction, and the first pixel region is arranged in a diagonal direction of the direction with respect to each of the second and third pixel regions; and
the single-layered region is not disposed between the first pixel region and the second and third pixel regions.

8. The display device of claim 1, wherein:
the first to third pixel regions are each provided in a plurality;
the first pixel regions are arranged in a direction, and the second pixel regions and the third pixel regions are arranged crosswise in the direction; and
the single-layered region is not disposed between a second pixel region and a third pixel region which are adjacent to each other among the second pixel regions and the third pixel regions.

9. The display device of claim 1, wherein in a plan view, an area of the second pixel region is less than an area of the first pixel region, and greater than an area of the third pixel region.

10. The display device of claim 1, wherein:
the fifth opening overlaps an entirety of the first pixel region and does not overlap the peripheral region, and the sixth opening overlaps an entirety of the second pixel region and does not overlap the peripheral region; and
the third color filter overlaps an entirety of the peripheral region.

11. The display device of claim 1, wherein:
the fifth opening overlaps an entirety of the first pixel region and in a plan view, an area of the fifth opening is greater than an area of the first pixel region;
the sixth opening overlaps an entirety of the second pixel region and, in a plan view, an area of the sixth opening is greater than an area of the second pixel region; and
the third color filter overlaps all remaining regions of the peripheral region except for a region overlapping the fifth and sixth openings.

12. The display device of claim 1, wherein a portion of the third color filter overlapping the multi-layered region is disposed on the first and second color filters.

13. The display device of claim 12, wherein the multi-layered region surrounds each of the first to third pixel regions in a plan view.

14. A display device comprising:
a base layer including first to third pixel regions and a peripheral region surrounding the first to third pixel regions and including first and second regions;
first to third light emission elements that respectively provide a source light to the first to third pixel regions, and that are disposed on the base layer;
an encapsulation layer covering the first to third light emission elements;
a bank portion including first to third bank openings respectively corresponding to the first to third light emission elements thereon, and disposed on the encapsulation layer;
a light control unit including first to third light control patterns disposed respectively corresponding to the first to third bank openings; and
a color filter layer disposed on the light control unit, wherein
the color filter layer includes:
a first color filter overlapping the first pixel region, and not overlapping the second and third pixel regions;
a second color filter overlapping the second pixel region, and not overlapping the first and third pixel regions; and
a third color filter overlapping the third pixel region, and not overlapping the first and second pixel regions,
wherein the first region overlaps only the third color filter, and the second region overlaps two or more of the first to third color filters.

15. The display device of claim 14, wherein:
the first color filter comprises:
a first pattern overlapping the first pixel region; and
a second pattern including first and second openings respectively overlapping the second and third pixel regions, and spaced apart from the first pattern, and
the second color filter comprises:
a third pattern including a third opening overlapping the first pixel region; and
a fourth pattern overlapping the second pixel region, including a fourth opening overlapping the third pixel region, and spaced apart from the third pattern.

16. The display device of claim 15, wherein:
the second pattern includes a first pattern opening surrounding the first pattern;
the fourth pattern includes a second pattern opening surrounding the third pattern; and
an inner surface of the second pattern defining the first pattern opening and an inner surface of the fourth pattern defining the second pattern opening are separated from the first and third patterns.

17. The display device of claim 15, wherein:
the second pattern comprises:
a first sub-pattern including the first opening; and
a second sub-pattern including the second opening, and spaced apart from the first sub-pattern, and
the fourth pattern comprises:
a third sub-pattern overlapping the second pixel region; and
a fourth sub-pattern including the fourth opening, and spaced apart from the third sub-pattern.

18. The display device of claim 14, wherein:
the second region surrounds each of the first to third pixel regions in a plan view, and
the third color filter overlapping the second region is disposed on the first and second color filters.

19. The display device of claim 14, wherein the first and second light control patterns each comprise quantum dots.

20. The display device of claim 14, wherein
the encapsulation layer comprises:
a first inorganic layer;
an organic layer disposed on the first inorganic layer; and
a second inorganic layer disposed on the organic layer, and
the bank portion and the light control unit each come into contact with the second inorganic layer.

21. An electronic device comprising a display device comprising:
a base layer including first to third pixel regions and a peripheral region surrounding the first to third pixel regions;

light emission elements that provide a source light to the first to third pixel regions, and that are disposed on the base layer; and a color filter layer disposed on the light emission elements, wherein:

the color filter layer includes:

a first color filter overlapping the first pixel region and the peripheral region, and including first and second openings respectively overlapping the second and third pixel regions;

a second color filter overlapping the second pixel region and the peripheral region, and including third and fourth openings respectively overlapping the first and third pixel regions; and a third color filter overlapping the third pixel region and the peripheral region, and including fifth and sixth openings respectively overlapping the first and second pixel regions, and the peripheral region includes:

a single-layered region not overlapped by the first and second color filters and overlapped by the third color filter; and a multi-layered region overlapped by at least two of the first to third color filters, wherein the single-layered region is disposed on an outer side of each of the first to fourth openings in a plan view.

* * * * *